(12) United States Patent
Wang et al.

(10) Patent No.: US 12,238,973 B2
(45) Date of Patent: Feb. 25, 2025

(54) DISPLAY SUBSTRATE AND PREPARATION METHOD THEREOF, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Jun Wang, Beijing (CN); Haitao Wang, Beijing (CN); Tongshang Su, Beijing (CN); Qinghe Wang, Beijing (CN); Ning Liu, Beijing (CN); Bin Zhou, Beijing (CN); Jun Cheng, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/637,458

(22) PCT Filed: Apr. 21, 2021

(86) PCT No.: PCT/CN2021/088789
§ 371 (c)(1),
(2) Date: Feb. 23, 2022

(87) PCT Pub. No.: WO2022/222078
PCT Pub. Date: Oct. 27, 2022

(65) Prior Publication Data
US 2024/0057388 A1 Feb. 15, 2024

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/80522* (2023.02)

(58) Field of Classification Search
CPC ............. H10K 59/122; H10K 59/1201; H10K 59/80522; H10K 50/824; H10K 59/1315;
(Continued)

(56) References Cited

U.S. PATENT DOCUMENTS 10,566,407 B2  2/2020  Lee et al.
2008/0174712 A1  7/2008  Kim et al.
(Continued)

FOREIGN PATENT DOCUMENTS

CN  103066212 A  4/2013
CN  109935621 A  6/2019
(Continued)

*Primary Examiner* — Douglas W Owens
(74) *Attorney, Agent, or Firm* — Ling Wu; Stephen Yang; Ling and Yang Intellectual Property

(57) ABSTRACT

A display substrate includes a driving circuit layer arranged on a base and a light emitting structure layer arranged on one side, away from the base, of the driving circuit layer; the light emitting structure layer includes an anode, a pixel definition layer, an organic light emitting layer, a cathode, and an auxiliary electrode; the pixel definition layer has a first pixel opening exposing the anode and a second pixel opening exposing the auxiliary electrode; the organic light emitting layer connected to the anode and the cathode connected to the organic light emitting layer are arranged in the first pixel opening; the organic light emitting layer separated from the auxiliary electrode and the cathode located on one side, away from the base, of the organic light emitting layer are arranged in the second pixel opening; and the cathode is connected to the auxiliary electrode in the second pixel opening.

19 Claims, 13 Drawing Sheets

(58) Field of Classification Search
CPC ............. H10K 59/80; H10K 59/80517; H10K 59/8731
See application file for complete search history.

(56) References Cited

U.S. PATENT DOCUMENTS

| | | |
|---|---|---|
| 2013/0056784 A1 | 3/2013 | Lee et al. |
| 2016/0126498 A1* | 5/2016 | Kim ................. H10K 50/818 |
| | | 257/40 |
| 2017/0125495 A1 | 5/2017 | Lee et al. |
| 2021/0233979 A1 | 7/2021 | Ma et al. |
| 2021/0257581 A1* | 8/2021 | Wang ................. H10K 59/122 |
| 2022/0093894 A1 | 3/2022 | Song et al. |
| 2022/0115483 A1* | 4/2022 | Li ..................... H10K 71/00 |

FOREIGN PATENT DOCUMENTS

| | | |
|---|---|---|
| CN | 110071225 A | 7/2019 |
| CN | 110176483 A | 8/2019 |
| CN | 110402496 A | 11/2019 |
| CN | 110890406 A | 3/2020 |
| CN | 112103326 A | 12/2020 |
| CN | 112289946 A | 1/2021 |
| IN | 106803544 A | 6/2017 |

* cited by examiner

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2021/088789 having an international filing date of Apr. 21, 2021, the entire content of which is hereby incorporated by reference.

TECHNICAL FIELD

Embodiments of the present disclosure relate, but are not limited, to the field of display technologies, and in particular, to a display substrate and a preparation method thereof, and a display apparatus.

BACKGROUND

An Organic Light Emitting Diode (OLED for short) is an active light emitting display device having advantages of self-illumination, a wide viewing angle, high contrast, low power consumption, an extremely high response speed, lightness and thinness, bendability, and a low cost, etc. With constant development of display technologies, a Flexible Display that uses an OLED as a light emitting device and uses a Thin Film Transistor (TFT for short) for signal control has become a mainstream product in the field of display at present.

SUMMARY

The following is a summary for subject matters described herein in detail. The summary is not intended to limit the scope of protection of claims.

An embodiment of the present disclosure provides a display substrate, including a driving circuit layer arranged on a base and a light emitting structure layer arranged on one side, away from the base, of the driving circuit layer. The light emitting structure layer includes an anode, a pixel definition layer, an organic light emitting layer, a cathode, and an auxiliary electrode.

The pixel definition layer has a first pixel opening exposing the anode and a second pixel opening exposing the auxiliary electrode. The organic light emitting layer connected to the anode and the cathode connected to the organic light emitting layer are arranged in the first pixel opening. The organic light emitting layer separated from the auxiliary electrode and the cathode located on one side, away from the base, of the organic light emitting layer are arranged in the second pixel opening. The cathode is connected to the auxiliary electrode in the second pixel opening.

In an exemplary embodiment, in a plane perpendicular to the base, a distance between an edge of the auxiliary electrode close to an edge of a top surface of the organic light emitting layer and the edge of the top surface of the organic light emitting layer located in the second pixel opening is greater than 1 μm.

In an exemplary embodiment, in a plane perpendicular to the base, a ratio of a thickness of an edge part, close to the auxiliary electrode, of the cathode located on a surface of the organic light emitting layer away from the base, to a thickness of an edge part, close to the pixel definition layer, of the cathode is 0.8 to 1.2.

In an exemplary embodiment, the auxiliary electrode includes a first auxiliary electrode, a second auxiliary electrode arranged on one side, away from the base, of the first auxiliary electrode, and a third auxiliary electrode arranged on one side, away from the base, of the second auxiliary electrode. An orthographic projection of the second auxiliary electrode on the base is located within a range of an orthographic projection of the third auxiliary electrode on the base. The orthographic projection of the second auxiliary electrode on the base is located within a range of an orthographic projection of the first auxiliary electrode on the base.

In an exemplary embodiment, a distance between an edge, close to the organic light emitting layer, of a surface, close to the base, of the third auxiliary electrode, and an edge, close to the organic light emitting layer, of a surface, away from the base, of the second auxiliary electrode is less than 1.25 μm.

In an exemplary embodiment, the cathode is in contact with each of: one side of an organic light emitting block away from the base, the first auxiliary electrode, the second auxiliary electrode, and the third auxiliary electrode.

In an exemplary embodiment, for the auxiliary electrode and the organic light emitting block that are stacked, the cathode is in contact with each of: a surface of the organic light emitting block away from the base, a side surface of the organic light emitting block, a side surface of the third auxiliary electrode, a surface, close to the base, of a part of the third auxiliary electrode protruding from the second auxiliary electrode, and a side surface of the second auxiliary electrode.

In an exemplary embodiment, the anode includes a first anode layer, a second anode layer arranged on one side, away from the base, of the first anode layer, and a third anode layer arranged on one side, away from the base, of the second anode. An orthographic projection of the second anode layer on the base is located within a range of an orthographic projection of the first anode layer on the base. The orthographic projection of the second anode layer on the base is located within a range of an orthographic projection of the third anode layer on the base.

In an exemplary embodiment, the first anode layer and the first auxiliary electrode are arranged in a same layer and are made of a same material. The second anode layer and the second auxiliary electrode are arranged in a same layer and are made of a same material. The third anode layer and the third auxiliary electrode are arranged in a same layer and are made of a same material.

In an exemplary embodiment, the organic light emitting layer is arranged on the first auxiliary electrode; a slope is formed on one side, close to the auxiliary electrode, of the organic light emitting layer. The cathode is arranged on the slope. A thickness, in a direction perpendicular to the slope, of the cathode located on the slope is less than a thickness, in a direction perpendicular to the base, of the cathode located on one side, away from the base, of the organic light emitting layer.

In an exemplary embodiment, an orthographic projection of the second pixel opening on the base is within a range of an orthographic projection of the first auxiliary electrode on the base.

In an exemplary embodiment, the cathode includes a first horizontal overlapping part and a second side wall overlapping part. The first horizontal overlapping part is overlapped with the first auxiliary electrode. The second side wall overlapping part is overlapped with the second auxiliary electrode. A thickness of the second side wall overlapping part in a direction parallel to the base is greater than that of the first horizontal overlapping part in a direction perpendicular to the base.

In an exemplary embodiment, the second side wall overlapping part is connected to the first auxiliary electrode. The second side wall overlapping part is in contact with a surface, close to the base, of the third auxiliary electrode. The second side wall overlapping part is connected to the first horizontal overlapping part.

In an exemplary embodiment, the driving circuit layer includes: a transistor and a power electrode located on the base, a passivation layer located on one side, away from the base, of the transistor and the power electrode, and a planarization layer located on one side, away from the base, of the passivation layer. The passivation layer and the planarization layer have anode vias and electrode vias. The anode vias expose a drain electrode of the transistor. The electrode vias expose the power electrode.

In an exemplary embodiment, the anode is connected to the drain electrode of the transistor through the anode vias. The auxiliary electrode is connected to the power electrode through the electrode vias.

In an exemplary embodiment, the light emitting structure layer further includes an organic light emitting block. The organic light emitting block is arranged on one side, away from the base, of the auxiliary electrode. An orthographic projection of the organic light emitting block on the base is overlapped with an orthographic projection of the auxiliary electrode on the base. The organic light emitting block and the organic light emitting layer are arranged in a same layer and are made of a same material. The organic light emitting block is isolated from the organic light emitting layer.

In an exemplary embodiment, a thickness, in a direction parallel to the base, of the cathode located on a side wall of the organic light emitting block is less than a thickness, in a direction perpendicular to the base, of the cathode located on one side, away from the base, of the organic light emitting block.

In an exemplary embodiment, orthographic projections of the electrode vias on the base are located within a range of an orthographic projection of the auxiliary electrode on the base.

An embodiment of the present disclosure further provides a display apparatus, including the display substrate as described in any one of previous items.

An embodiment of the present disclosure further provides a preparation method of a display substrate, including: forming a driving circuit layer on a base; and forming a light emitting structure layer on the driving circuit layer, wherein the light emitting structure layer includes an anode, a pixel definition layer, an organic light emitting layer, a cathode, and an auxiliary electrode; the pixel definition layer has a first pixel opening exposing the anode and a second pixel opening exposing the auxiliary electrode; the organic light emitting layer connected to the anode and the cathode connected to the organic light emitting layer are arranged in the first pixel opening; the organic light emitting layer separated from the auxiliary electrode and the cathode located on one side, away from the base, of the organic light emitting layer are arranged in the second pixel opening; and the cathode is connected to the auxiliary electrode in the second pixel opening.

After the accompanying drawings and detailed descriptions are read and understood, other aspects may be understood.

BRIEF DESCRIPTION OF DRAWINGS

The accompanying drawings are used for providing further understanding of technical solutions of the present disclosure, constitute a part of the specification, and are used for explaining the technical solutions of the present disclosure together with the embodiments of the present disclosure, but do not constitute limitations to the technical solutions of the present disclosure. Shapes and sizes of various components in the accompanying drawings do not reflect true scale and are only intended to illustrate contents of the present disclosure.

FIG. 5b is a schematic diagram of an enlarged structure of a region A in FIG. 5a.

FIG. 6b is a cross-sectional view along an A-A direction in FIG. 6a.

FIG. 7b is a cross-sectional view along an A-A direction in FIG. 7a.

FIG. 8b is a cross-sectional view along an A-A direction in FIG. 8a.

FIG. 9b is a cross-sectional view along an A-A direction in FIG. 9a.

FIG. 10b is a cross-sectional view along an A-A direction in FIG. 10a.

FIG. 11b is a cross-sectional view along an A-A direction in FIG. 11a.

FIG. 12b is a cross-sectional view along an A-A direction in FIG. 12a.

DETAILED DESCRIPTION

Figure 1:
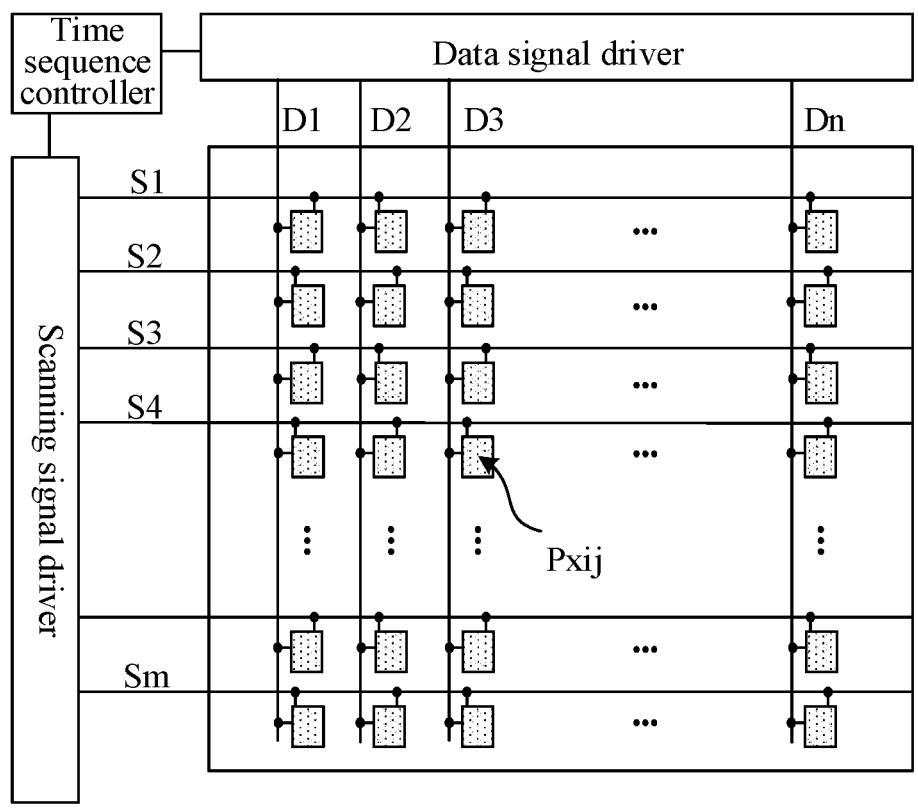
FIG. 1 is a schematic diagram of a structure of a display apparatus.

To make objectives, technical solutions, and advantages of the present disclosure clearer, the embodiments of the present disclosure will be described in detail with reference to the accompanying drawings. It is noted that embodiments may be implemented in multiple different forms. Those of ordinary skill in the art may easily understand such a fact that manners and contents may be transformed into various forms without departing from spirit and scope of the present disclosure. Therefore, the present disclosure should not be construed as only being limited to the contents recorded in the following embodiments. The embodiments in the present disclosure and features in the embodiments may be combined arbitrarily with each other without conflict.

In the accompanying drawings, a size of each constituent element, a thicknesses of a layer, or a region may be exaggerated sometimes for clarity. Therefore, one mode of the present disclosure is not necessarily limited to a size, and a shape and size of each component in the accompanying drawings do not reflect true scale. In addition, the accompanying drawings schematically show ideal examples, and one mode of the present disclosure is not limited to a shape, a numerical value, or the like shown in the accompanying drawings.

Ordinal numerals such as "first", "second", and "third" in the specification are set to avoid confusion of constituent elements, but are not intended to limit in terms of quantity.

In the specification, for convenience, words and sentences indicating orientations or positional relationships, such as "center", "upper", "lower", "front", "back", "vertical", "horizontal", "top", "bottom", "inside", and "outside", are used for describing positional relationships of constituent elements with reference to the accompanying drawings, and are merely for facilitating describing the specification and simplifying the description, rather than indicating or implying that referred apparatuses or elements must have particular orientations, and be constructed and operated in particular orientations. Thus, it cannot be construed as a limitation to the present disclosure. The positional relationships of the constituent elements appropriately change according to directions of describing the constituent elements. Therefore, it is not limited to the words and sentences described in the specification, which may be replaced appropriately according to a situation.

In the specification, unless otherwise specified and defined explicitly, terms "mounted", "mutually connected", and "connection" should be broadly understood. For example, it may be a fixed connection, or a detachable connection, or an integral connection. It may be a mechanical connection or an electric connection. It may be a direct connection, or an indirect connection through an intermediate, or communication inside two elements. Those of ordinary skill in the art may understand specific meanings of these terms in the present disclosure in specific situations.

In the specification, a transistor refers to an element that at least includes three terminals, that is, a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, a channel region refers to a region that a current mainly flows through.

In the specification, a first electrode may be a drain electrode, and a second electrode may be a source electrode. Or, a first electrode may be a source electrode, and a second electrode may be a drain electrode. In cases that transistors with opposite polarities are used, or a direction of a current changes during work of a circuit, or the like, functions of the "source electrode" and the "drain electrode" may sometimes be exchanged. Therefore, the "source electrode" and the "drain electrode" may be exchanged in the specification.

In the specification, an "electric connection" includes a case where constituent elements are connected together through an element having some electric function. There is no specific restriction on the "element having some electrical function" as long as it may transmit and receive electrical signals between connected constituent elements. An example of the "element having some electric function" includes not only an electrode and a wiring, but also a switching element such as a transistor, a resistor, an inductor, a capacitor, and another element having various functions, etc.

In the specification, "parallel" refers to a state in which an angle formed by two straight lines is greater than $-10°$ and less than $10°$, and thus may also include a state in which an angle is greater than $-5°$ and less than $5°$. In addition, "perpendicular" refers to a state in which an angle formed by two straight lines is greater than $80°$ and less than $100°$, and thus may also include a state in which an angle is greater than $85°$ and less than $95°$.

In the specification, "film" and "layer" may be exchanged. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values in process and measurement error ranges are allowed.

FIG. 1 is a schematic diagram of a structure of a display apparatus. As shown in FIG. 1, an OLED display apparatus may include a time sequence controller, a data driver, a scanning driver, and a pixel array. The pixel array may include a plurality of scanning lines (S1 to Sm), a plurality of data lines (D1 to Dn), and a plurality of sub-pixels Pxij. In an exemplary embodiment, the time sequence controller may provide a gray value and a control signal suitable for specifications of the data driver to the data driver, may provide a clock signal, a scanning start signal, etc. suitable for specifications of the scanning driver to the scanning driver. The data driver may generate data voltages to be provided to data lines D1, D2, D3, . . . , and Dn by using the gray value and the control signal received from the time sequence controller. For example, the data driver may sample the gray value by using the clock signal, and apply the data voltage corresponding to the gray value to the data lines D1 to Dn by taking a sub-pixel row as a unit, and n may be a natural number. The scanning driver may generate scanning signals to be provided to scanning lines S1, S2, S3, . . . , and Sm by using the clock signal, the scanning start signal, etc. received from the time sequence controller. For example, the scanning driver may provide a scanning signal with an on-level pulse to the scanning lines S1 to Sm sequentially. For example, the scanning driver may be constructed in a form of a shift register and may generate a scanning signal in a manner of sequentially transmitting the scanning start signal provided in a form of the on-level pulse to a next-stage circuit under control of the clock signal, and m may be a natural number. A sub-pixel array may include a plurality of sub-pixels Pxij. Each sub-pixel Pxij may be connected to a corresponding data line and a corresponding scanning line; and i and j may be natural numbers. The sub-pixel Pxij may refer to a sub-pixel in which a transistor is connected to an i-th scanning line and is connected to a j-th data line.

Figure 2:
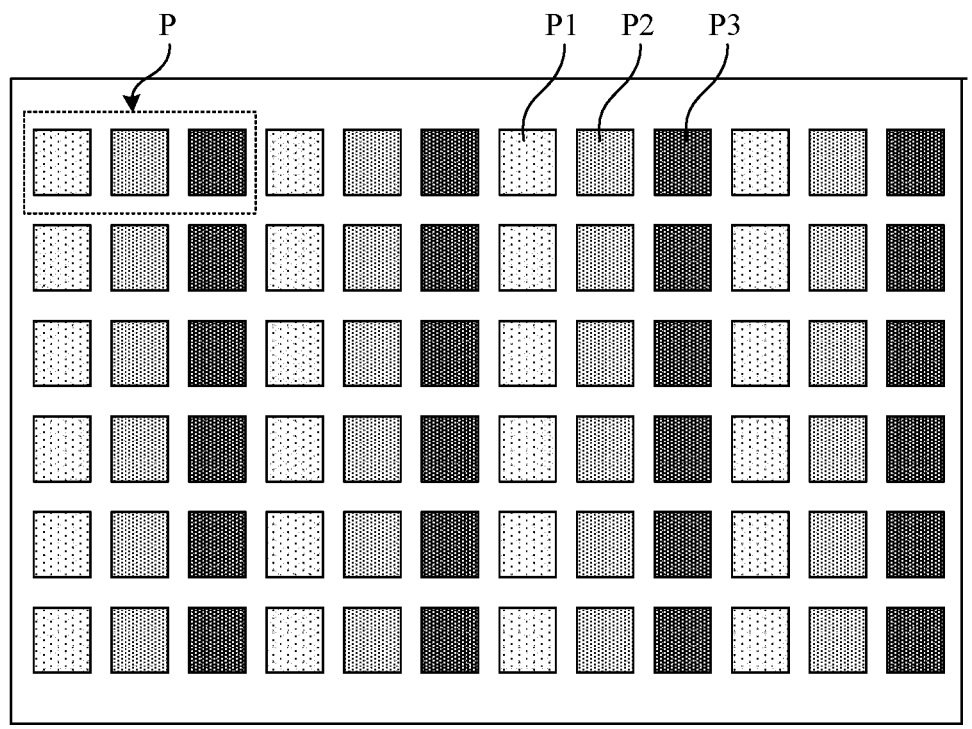
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix. At least one of the plurality of pixel units P includes a first light emitting unit (sub-pixel) P1 that emits first-color light, a second light emitting unit P2 that emits second-color light, and a third light emitting unit P3 that emits third-color light. Each of the first light emitting unit P1, the second light emitting unit P2, and the third light emitting unit P3 includes a pixel driving circuit and a light emitting device. Pixel driving circuits in the first light emitting unit P1, the second light emitting unit P2, and the third light emitting unit P3 are respectively connected to scanning lines, data lines, and light emitting signal lines. The pixel driving circuit is arranged to receive a data voltage transmitted by a data line under control of a scanning line and a light emitting signal line, and output a corresponding current to the light emitting device. Light emitting devices in the first light emitting unit P1, the second light emitting unit P2, and the third light emitting unit P3 are respectively connected to the pixel driving circuits of light emitting units where they are located. The light emitting device is arranged to, in response to the current output by the pixel driving circuit of the light emitting unit where it is located, emit light with corresponding brightness.

In an exemplary embodiment, a pixel unit P may include a Red (R) light emitting unit, a Green (G) light emitting unit, and a Blue (B) light emitting unit, or may include a red light emitting unit, a green light emitting unit, a blue light emitting unit, and a white light emitting unit, which is not limited in the present disclosure. In an exemplary embodiment, a shape of a light emitting unit in the pixel unit may be a rectangle, a rhombus, a pentagon, or a hexagon. When the pixel unit includes three light emitting units, the three light emitting units may be arranged in parallel in a horizontal direction, in parallel in a vertical direction, or in a pyramid manner with two units sitting at bottom and one unit placed on top. When the pixel unit includes four light emitting units, the four light emitting units may be arranged in parallel in a horizontal direction, in parallel in a vertical direction, or in a square, which is not limited in the present disclosure.

Figure 3:
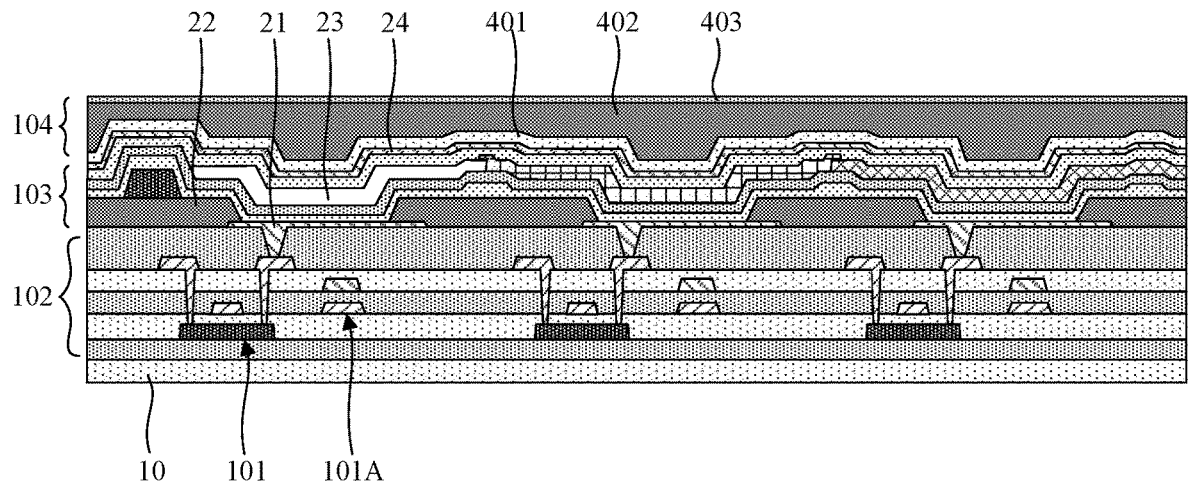
FIG. 3 is a schematic diagram of a cross-sectional structure of a display substrate.

FIG. 3 is a schematic diagram of a cross-sectional structure of a display substrate, which illustrates structures of three sub-pixels of an OLED display substrate. As shown in FIG. 3, in a plane perpendicular to the display substrate, the display substrate may include a driving circuit layer 102 arranged on a base 10, a light emitting structure layer 103 arranged on one side, away from the base 10, of the driving circuit layer 102, and an encapsulation layer 104 arranged on one side, away from the base 10, of the light emitting structure layer 103. In some possible embodiments, the display substrate may include other film layers, such as a spacer column, which is not limited by the present disclosure herein.

In an exemplary embodiment, the base 10 may be a flexible base, or may be a rigid base. The driving circuit layer 102 of each sub-pixel may include a plurality of transistors and a storage capacitor forming a pixel driving circuit. FIG. 3 illustrates by taking each sub-pixel including one transistor 101 and one storage capacitor 101A as an example. The light emitting structure layer 103 may include an anode 301, a pixel definition layer 302, an organic light emitting layer 303, and a cathode 304. The anode 301 is connected to a drain electrode of a transistor 101 through a via. The organic light emitting layer 303 is connected to the anode 301. The cathode 304 is connected to the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 which are stacked. The first encapsulation layer 401 and the third encapsulation layer 403 may be made of an inorganic material. The second encapsulation layer 402 may be made of an organic material. The second encapsulation layer 402 is arranged between the first encapsulation layer 401 and the third encapsulation layer 403 so that it may be ensured that external water vapor cannot enter the light emitting structure layer 103.

Figure 4:
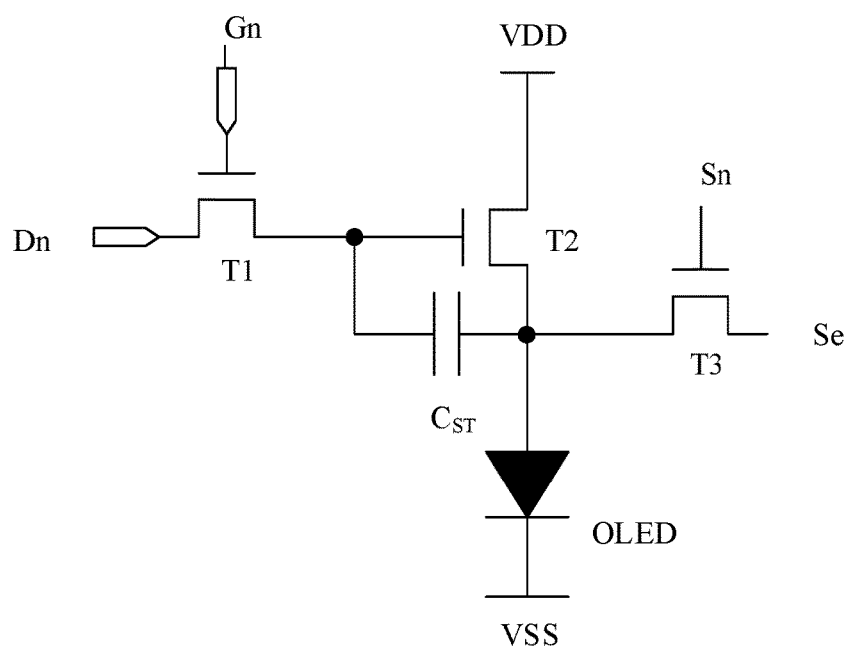
FIG. 4 is a schematic diagram of an equivalent circuit of a pixel driving circuit.

In an exemplary embodiment, the pixel driving circuit may be of a 3T1C, 4T1C, 5T1C, 5T2C, 6T1C, or 7T1C structure. FIG. 4 is a schematic diagram of an equivalent circuit of a pixel driving circuit. As shown in FIG. 4, the pixel driving circuit is of a 3T1C structure, and may include three switching transistors (a first transistor T1, a second transistor T2, and a third transistor T3), a storage capacitor $C_{ST}$, and six signal lines (a data line Dn, a first scanning line Gn, a second scanning line Sn, a compensation line Se, a first power line VDD, and a second power line VSS). In an exemplary embodiment, the first transistor T1 is a switching transistor, the second transistor T2 is a driving transistor, and the third transistor T3 is a compensation transistor. A gate electrode of the first transistor T1 is coupled to the first scanning line Gn, a first electrode of the first transistor T1 is coupled to the data line Dn, and a second electrode of the first transistor T1 is coupled to a gate electrode of the second transistor T2. The first transistor T1 is controlled by the first scanning line Gn to receive a data signal transmitted by the data line Dn, so that A gate electrode of the second transistor T2 receives the data signal. The gate electrode of the second transistor T2 is coupled to the second electrode of the first transistor T1, a first electrode of the second transistor T2 is coupled to the first power line VDD, and a second electrode of the second transistor T2 is coupled to a first electrode of an OLED. The second transistor T2 is controlled by a data signal received by the gate electrode thereof to generate a corresponding current at the second electrode. A gate electrode of the third transistor T3 is coupled to the second scanning line Sn, a first electrode of the third transistor T3 is connected to the compensation line Se, and a second electrode of the third transistor T3 is coupled to the second electrode of the second transistor T2. The third transistor T3 is configured to, in response to a compensation time sequence, extract a threshold voltage Vth and a mobility of the second transistor T2, so as to compensate the threshold voltage Vth. The first electrode of the OLED is coupled to the second electrode of the second transistor T2, and a second electrode of the OLED is coupled to the second power line VSS. The OLED is configured to emit light with corresponding brightness in response to the current of the second electrode of the second transistor T2. A first electrode of the storage capacitor $C_{ST}$ is coupled to the gate electrode of the second transistor T2, a second electrode of the storage capacitor $C_{ST}$ is coupled to the second electrode of the second transistor T2, and the storage capacitor $C_{ST}$ is configured to store a potential of the gate electrode of the second transistor T2.

In an exemplary embodiment, a signal of the first power line VDD is a signal that keeps providing a high level. A signal of the second power line VSS is a low-level signal. The first transistor T1 to the third transistor T3 may be P-type transistors or N-type transistors. Using a same type of transistors in the pixel driving circuit may simplify a process flow, reduce process difficulties of the display panel, and improve a product yield. In some possible exemplary embodiments, the first transistor T1 to the third transistor T3 may include P-type transistors and N-type transistors. In an exemplary embodiment, the light emitting device may be an Organic Light Emitting Device (OLED), including a first electrode (anode), an organic light emitting layer, and a second electrode (cathode) that are stacked.

According to light emitting directions, OLED display substrates may be divided into three types: a bottom emission OLED, a top emission OLED, and a double-sided emission OLED. The bottom emission OLED is that light emits from a bottom direction of a substrate. The top emission OLED is that light emits from a top direction of a substrate. The double-sided emission OLED is that light emits from a bottom direction of a substrate and a top direction of the substrate simultaneously. Compared with the bottom emission OLED, the top emission OLED has advantages of a large aperture ratio, high color purity, and easiness in implementation of Pixels per inch (PPI), etc., and has received extensive attention.

For the top emission OLED, since a light emitting direction is on one side of a cathode, the cathode is required to have a good light transmittance and conductivity. However, it is difficult to meet requirements of the light transmittance and conductivity at the same time. For example, in order meet a requirement of conductivity, a thickness of the cathode is necessarily required to be larger, but at this time, the transmittance of the cathode is low, and a problem of viewing angle color deviation will occur. In order to meet a requirement of the light transmittance, the thickness of the cathode is necessarily required to be thinner, but at this time, an impedance of the cathode is relatively large, which will not only lead to problems of voltage rise and increased power consumption, but also lead to a problem of uneven voltage distribution on various positions of the cathode to cause uneven brightness.

In a top emission OLED display substrate, in order to reduce a voltage drop of a cathode, an auxiliary electrode is adopted to reduce an impedance of the cathode, thereby reducing the voltage drop of the cathode. In the display substrate, the auxiliary electrode is arranged on a driving circuit layer, and the cathode is arranged on a light emitting structure layer. Vias are formed in the driving circuit layer and the light emitting structure layer through a laser process, so that the cathode is connected to the auxiliary electrode through the vias. A large number of particles will be generated when the vias are formed in an organic light emitting layer through the laser process, so the structure and the process seriously affect a product yield adversely. Since tact time of a single product is prolonged by use of the laser process, the structure and the process greatly reduce a production efficiency. Since the vias formed through the laser process are small, and a contact area between the cathode and the auxiliary electrode is small, the voltage drop of the cathode cannot be effectively reduced through the structure and the process, which affects a display effect.

Figure 5A:
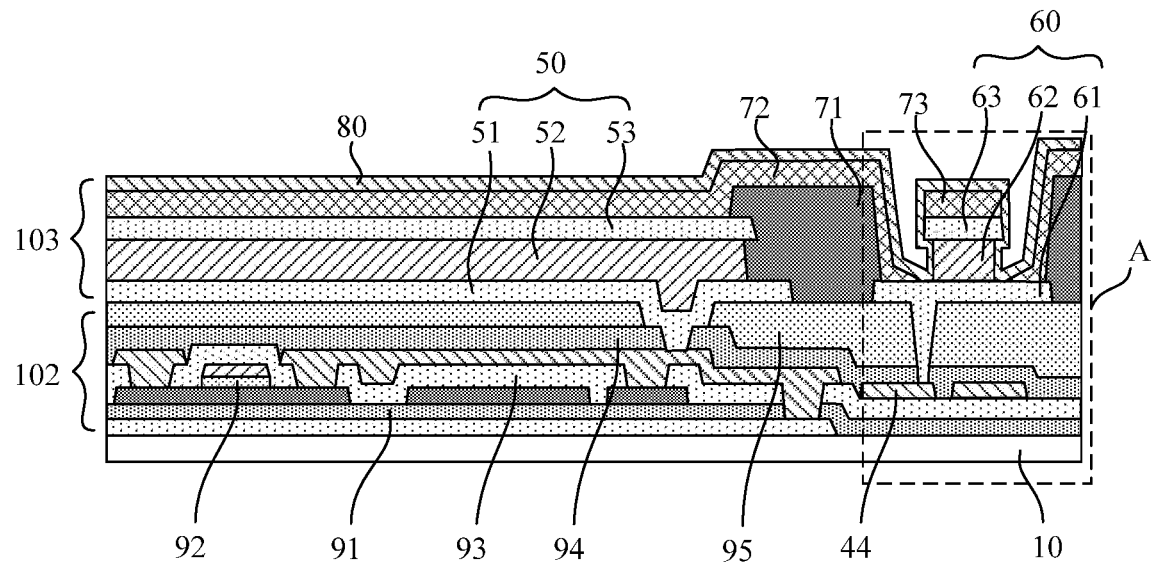
FIG. 5a is a schematic diagram of a structure of a display substrate according to an embodiment of the present disclosure.
Figure 5B:
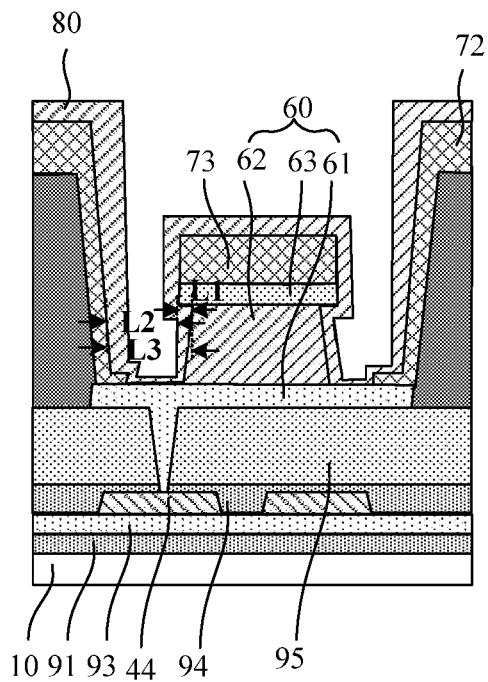

FIG. 5a is a schematic diagram of a structure of a display substrate of an exemplary embodiment of the present disclosure, which illustrates a cross-sectional structure of a sub-pixel in the display substrate. FIG. 5b is a schematic diagram of an enlarged structure of a region A in FIG. 5a. As shown in FIG. 5a and FIG. 5b, in an exemplary embodiment, in a plane perpendicular to the display substrate, the display substrate may include a driving circuit layer 102 arranged on a base 10 and a light emitting structure layer 103 arranged on one side, away from the base, of the driving circuit layer 102. The driving circuit layer 102 may include a second power line 44, and a transistor and a storage capacitor forming the pixel driving circuit. The light emitting structure layer 103 may include an anode 50, an auxiliary electrode 60, a pixel definition layer 71, an organic light emitting layer 72, and a cathode 80. The organic light emitting layer 72 is connected to the anode 50 and the cathode 80 respectively. The auxiliary electrode 60 is connected to the second power line 44. The cathode 80 is connected to the auxiliary electrode 60. The auxiliary electrode 60 includes a bottom surface close to the base, a top surface away from the base, and a side surface arranged between the bottom surface and the top surface. The cathode 80 is in contact with the side surface of the auxiliary electrode 60.

In an exemplary embodiment, in a plane perpendicular to the display substrate, the auxiliary electrode 60 may include a first auxiliary electrode 61, a second auxiliary electrode 62 arranged on one side, away from the base, of the first auxiliary electrode 61, and a third auxiliary electrode 63 arranged on one side, away from the base, of the second auxiliary electrode 62. The first auxiliary electrode 61, the second auxiliary electrode 62, and the third auxiliary electrode 63 that are stacked form a structure like the Chinese character " 工 ". An orthographic projection of the second auxiliary electrode 62 on the base is located within a range of orthographic projections of the first auxiliary electrode 61 and the third auxiliary electrode 63 on the base.

In an exemplary embodiment, the light emitting structure layer 103 may include an organic light emitting block 73. The organic light emitting block 73 and the organic light emitting layer 72 are arranged in a same layer, are made of a same material, and are formed through a same evaporation process simultaneously. In an exemplary embodiment, the organic light emitting block 73 is arranged on one side, away from the base, of the auxiliary electrode 60, and the organic light emitting block 73 is isolated from the organic light emitting layer 72.

In an exemplary embodiment, the organic light emitting block 73 is arranged on one side, away from the base, of the third auxiliary electrode 63, and an orthographic projection of the organic light emitting block 73 on the base is located within a range of an orthographic projection of the third auxiliary electrode 63 on the base.

In an exemplary embodiment, in a plane perpendicular to the display substrate, the anode 50 may include a first anode 51, a second anode 52 arranged on one side, away from the base, of the first anode 51, and a third anode 53 arranged on one side, away from the base, of the second anode 52. The first anode 51, the second anode 52, and the third anode 53 that are stacked form a structure like the Chinese character " 工 ". An orthographic projection of the second anode 52 on the base is located within a range of orthographic projections of the first anode 51 and the third anode 53 on the base.

In an exemplary embodiment, the first auxiliary electrode 61 and the first anode 51 are arranged in a same layer, are made of a same material, and are formed through a same patterning process simultaneously.

In an exemplary embodiment, the second auxiliary electrode 62 and the second anode 52 are arranged in a same layer, are made of a same material, and are formed through a same patterning process simultaneously.

In an exemplary embodiment, the third auxiliary electrode 63 and the third anode 53 are arranged in a same layer, are made of a same material, and are formed through a same patterning process simultaneously.

In an exemplary embodiment, the driving circuit layer 102 may include a first conductive layer arranged on the base 10, a first insulation layer 91 covering the first conductive layer, a semiconductor layer arranged on the first insulation layer 91, a second insulation layer 92 arranged on the semiconductor layer, a second conductive layer arranged on the second insulation layer 92, a third insulation layer 93 covering the second conductive layer, a third conductive layer arranged on the third insulation layer 93, a fourth insulation layer 94 covering the third conductive layer, and a planarization layer 95 arranged on the fourth insulation layer 94. The first conductive layer at least includes a shielding layer. The semiconductor layer at least includes a first capacitor polar plate and active layers of a plurality of transistors. The second conductive layer at least includes gate electrodes of the plurality of transistors. The third conductive layer at least includes a second power line, a second capacitor polar plate, and first electrodes and second electrodes of the plurality of transistors. The second capacitor polar plate is connected to the shielding layer through a via. The second capacitor polar plate and the first capacitor polar plate form a first storage capacitor. The shielding layer and the first capacitor polar plate form a second storage capacitor. An anode via and an electrode via are arranged on the fourth insulation layer 94 and the planarization layer 95, and an anode is connected to the second capacitor polar plate via the anode via, and an auxiliary electrode is connected to the second power line through the electrode via.

In an exemplary embodiment, the pixel definition layer 71 in the light emitting structure layer 103 is provided with a first pixel opening and a second pixel opening. The first pixel opening exposes a partial surface of the third anode 53. The second pixel opening exposes the second auxiliary electrode 62 and the third auxiliary electrode 63.

In an exemplary embodiment, the cathode 80 in the light emitting structure layer 103 achieves a large-area contact connection between the cathode 80 and the auxiliary electrode 60 in a manner of wrapping the organic light emitting block 73 and the auxiliary electrode 60.

In an exemplary embodiment, for the first auxiliary electrode 61, the second auxiliary electrode 62, the third auxiliary electrode 63, and the organic light emitting block 73 that are stacked in a direction away from the base, an exposed surface of the organic light emitting block 73 includes: an upper surface away from the base and a side surface of a side part. An exposed surface of the third auxiliary electrode 63 includes: a third side surface of a side part, and a third bottom surface, close to the base, of a part protruding from the second auxiliary electrode 62. An exposed surface of the second auxiliary electrode 62 includes: a second side surface of a side part. In an exemplary embodiment, a side surface refers to a plurality of circumferential surfaces having normal directions parallel or nearly parallel to a plane of the base. The cathode 80 wrapping the organic light emitting block 73 and the auxiliary electrode 60 refers to that: the cathode 80 covers or partially covers the upper surface and all side surfaces of the organic light emitting block 73, the cathode 80 covers or partially covers all third side surfaces and third bottom surfaces of the third auxiliary electrode 63, and the cathode 80 completely covers or partially covers all second side surfaces of the second auxiliary electrode 62.

In an exemplary embodiment, an orthographic projection of the second pixel opening on the base is located within a range of an orthographic projection of the first auxiliary electrode 61 on the base.

As shown in FIG. 5a and FIG. 5b, for the organic light emitting block 73, a part of the cathode 80 covers a surface of the organic light emitting block 73 away from the base, and another part of the cathode 80 covers the side surface of the organic light emitting block 73. For the third auxiliary electrode 63, the organic light emitting block 73 covers a surface of the third auxiliary electrode 63 away from the base. A part of the cathode 80 covers the third side surface of the third auxiliary electrode 63, and another part of the cathode 80 covers the third bottom surface on a lower side of the third auxiliary electrode 63, that is, the cathode 80 covers a bottom surface of a part, protruding from the second auxiliary electrode 62, of the third auxiliary electrode 63. Thus, not only a connection between the cathode 80 and the third auxiliary electrode 63 is achieved, but also the wrapping of the organic light emitting block 73 is achieved. Since the cathode 80 and the third auxiliary electrode 63 are connected through the third side surface and the third bottom surface, a potential of the cathode 80 on an upper side of the organic light emitting block 73 is equal to a potential of the third auxiliary electrode 63 on a lower side of the organic light emitting block 73, that is, potentials of two sides of the organic light emitting block 73 are equal, which ensures that the organic light emitting block 73 does not emit light, and avoids a flickering phenomenon caused by emitting light from the organic light emitting block 73. For the second auxiliary electrode 62, the cathode 80 covers the second side surface of a side part of the second auxiliary electrode 62. According to an exemplary embodiment of the present disclosure, through a contact connection between the cathode and the second side surface of the second auxiliary electrode, a contact area between the cathode and the auxiliary electrode is effectively increased, a resistance at a contact interface is effectively reduced, and a display effect is improved.

In an exemplary embodiment of the present disclosure, as shown in FIG. 5b, in a plane perpendicular to the base, a distance L1 between an edge, close to the organic light emitting layer 72, of a surface of the third auxiliary electrode 63 close to the base, and an edge, close to the organic light emitting layer 72, of a surface of the second auxiliary electrode 62 away from the base is less than 1.25 μm. Thus, a part of the third auxiliary electrode 63 protruding out of the second auxiliary electrode 62 is prevented from being too close to the organic light emitting layer 72 located in an electrode via to affect preparation of the cathode 80 located in the electrode via adversely, which ensures uniformity of a thickness of a film of the cathode 80 located in the electrode via and that located outside the electrode via, thereby ensuring light emitting uniformity of the organic light emitting layer 72.

Exemplarily, a distance L1 between an edge, close to the organic light emitting layer 72, of a surface of the third auxiliary electrode 63 close to the base, and an edge, close to the organic light emitting layer 72, of a surface of the second auxiliary electrode 62 away from the base may be 0.95 μm.

In an exemplary embodiment of the present disclosure, in a plane perpendicular to the base, a ratio of a thickness of an edge part, close to the auxiliary electrode 60, of the cathode 80 located on a surface of the organic light emitting layer 72 away from the base, to a thickness of an edge part, close to the pixel definition layer 71, of the cathode 80 is 0.8 to 1.2.

In an exemplary embodiment of the present disclosure, as shown in FIG. 5b, a distance L2 between an edge of the third auxiliary electrode 63 close to an edge of a top surface of the organic light emitting layer 72 and the edge of the top surface of the organic light emitting layer 72 located in the second pixel opening is greater than 1 μm. Thus, the part of the third auxiliary electrode 63 protruding out of the second auxiliary electrode 62 is prevented from being too close to the organic light emitting layer 72 located in the electrode via to affect preparation of the cathode 80 located in the electrode via adversely, which ensures the uniformity of the thickness of the film of the cathode 80 located in the electrode via and that located outside the electrode via, thereby ensuring the light emitting uniformity of the organic light emitting layer 72.

Exemplarily, a distance L2 between an edge of the third auxiliary electrode 63 close to an edge of a top surface of the organic light emitting layer 72 and the edge of the top surface of the organic light emitting layer 72 located in the second pixel opening may be 1.3 μm.

In an exemplary embodiment of the present disclosure, as shown in FIG. 5b, the organic light emitting layer 72 is arranged on the first auxiliary electrode 61. One side of the organic light emitting layer 72 close to the auxiliary electrode 60 forms a slope. The cathode 80 is arranged on the slope. A thickness, in a direction perpendicular to the slope, of the cathode 80 located on the slope is less than a thickness, in a direction perpendicular to the base, of the cathode located on one side of the organic light emitting layer 72 away from the base.

In an exemplary embodiment of the present disclosure, in a plane parallel to the display substrate, a shape of the auxiliary electrode 60 may be any one or more of following: a triangle, a rectangle, a trapezoid, a polygon, a circle, and an ellipse.

In an exemplary embodiment of the present disclosure, in a plane parallel to the display substrate, the display substrate includes a plurality of pixel units. Auxiliary electrodes may be arranged between anodes of adjacent pixel units.

A preparation process of the display substrate will be exemplarily described below. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a thin film prepared from a material on a base through a process such as depositing, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" obtained after the patterning process includes at least one "pattern". "A and B are arranged in a same layer" in the present disclosure refers to that A and B are formed simultaneously through a same patterning process, and a "thickness" of a film layer is a dimension of the film layer in a direction perpendicular to the display substrate. In an exemplary embodiment of the present disclosure, "an orthographic projection of B is located within a range of an orthographic projection of A" refers to that a boundary of the orthographic projection of B falls within a range of a boundary of the orthographic projection of A, or a boundary of the orthographic projection of A is overlapped with a boundary of the orthographic projection of B.

In an exemplary embodiment, taking two pixel units (six sub-pixels) of the display substrate as an example, a preparation process of the display substrate may include following operations.

(1) A base is provided. In an exemplary embodiment, the base may be a flexible base, or may be a rigid base. In an exemplary embodiment, the flexible base may include a first flexible material layer, a first inorganic material layer, a semiconductor layer, a second flexible material layer, and a second inorganic material layer that are stacked. A material of the first flexible material layer and the second flexible material layer may be Polyimide (PI), Polyethylene Terephthalate (PET), or a Polymer soft film subjected to a surface treatment, etc. A material of the first inorganic material layer and the second inorganic material layer may be Silicon Nitride (SiNx) or Silicon Oxide (SiOx), etc., which are used for improving water and oxygen resistance of the base. The first inorganic material layer and the second inorganic material layer may also be called Barrier layers. A material of the semiconductor layer may be amorphous silicon (a-si). In an exemplary embodiment, taking one stacking structure as an example, a preparation process thereof may include: first, a glass carrier plate is coated with a layer of polyimide, and a first flexible (PI1) layer is formed after curing and forming a film. Then, a barrier thin film is deposited on the first flexible layer, so as to form a first Barrier (Barrier 1) layer covering the first flexible layer. Then, an amorphous silicon thin film is deposited on the first Barrier layer, so as to form an amorphous silicon (a-si) layer covering the first Barrier layer. Then, the amorphous silicon layer is coated with a layer of polyimide again, and a second flexible (PI2) layer is formed after curing and forming a film. Then, a barrier thin film is deposited on the second flexible layer, so as to form a second Barrier (Barrier 2) layer covering the second flexible layer, thereby completing preparation of the base.

Figure 6A:
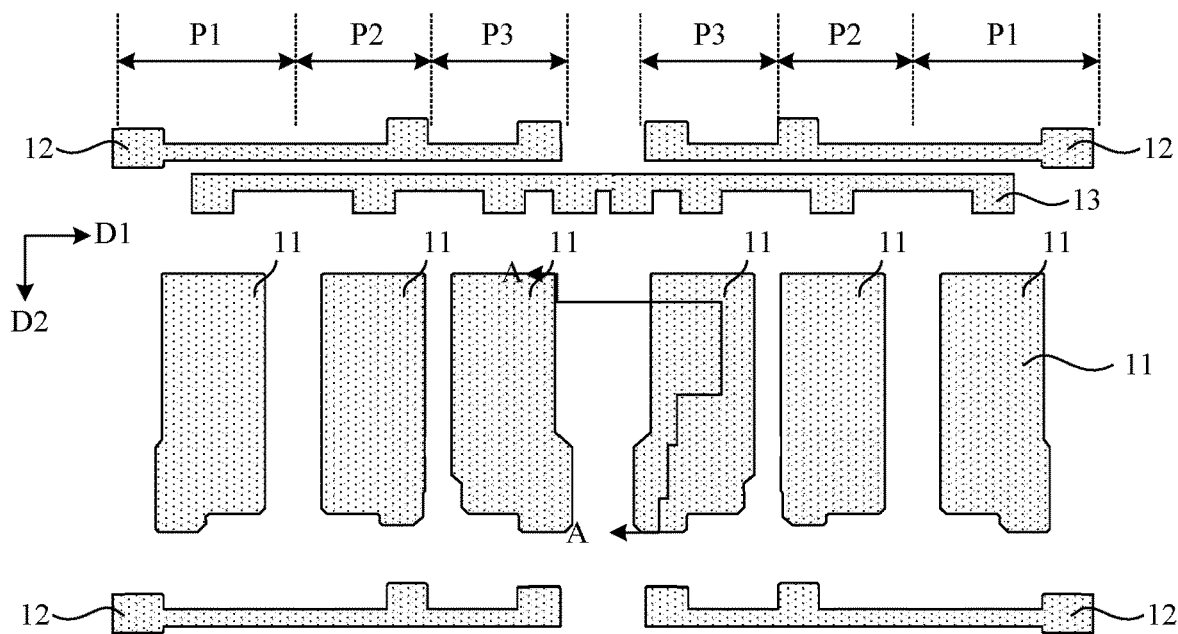
FIG. 6a is a schematic diagram after a first conductive layer pattern is formed according to an embodiment of the present disclosure.

(2) A first conductive layer pattern is formed. In an exemplary embodiment, the operation that the first conductive layer pattern is formed may include: a first metal thin film is deposited on the base. Patterning is performed on the first metal thin film through a patterning process, so as to form the first conductive layer pattern on the base. The first conductive layer pattern at least includes: a shielding layer 11, a power connecting line 12, and a compensation connecting line 13, as shown in FIG. 6a and FIG. 6b, and FIG. 6b is a cross-sectional view along an A-A direction in FIG. 6a.

In an exemplary embodiment, the shielding layer 11 is arranged in each sub-pixel, and may be rectangular with a protrusion or a groove. The power connecting line 12 is arranged in a pixel unit, and extends to a first sub-pixel P1, a second sub-pixel P2, and a third sub-pixel P3 along a first direction D1 or an opposite direction of the first direction D1. Power connecting lines 12 between adjacent pixel units are arranged at intervals. The power connecting line 12 is configured to connect the first power line formed subsequently, and provide a power signal for a pixel driving circuit of each sub-pixel of a pixel unit where the power connecting line 12 is located. The compensation connecting line 13 is arranged in a pixel unit, and extends to the first sub-pixel P1, the second sub-pixel P2, and the third sub-pixel P3 in the first direction D1 or the opposite direction of the first direction D1. Compensation connecting lines 13 of two adjacent pixel units are connected with each other to form an integrated structure. The compensation connecting line 13 is configured to connect the compensation line formed subsequently, and provide a compensation signal for a pixel driving circuit of each sub-pixel of a pixel unit where the compensation connecting line 13 is located.

Figure 6B:
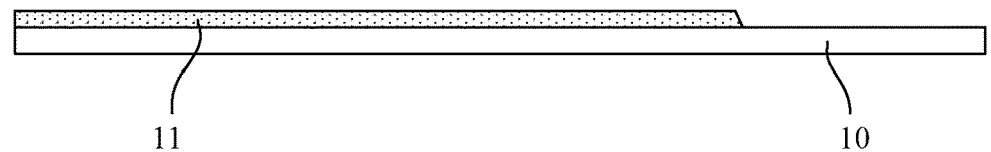

As shown in FIG. 6b, after the process, the display substrate includes a first conductive layer arranged on the base 10. The first conductive layer at least includes a shielding layer 11.

Figure 7A:
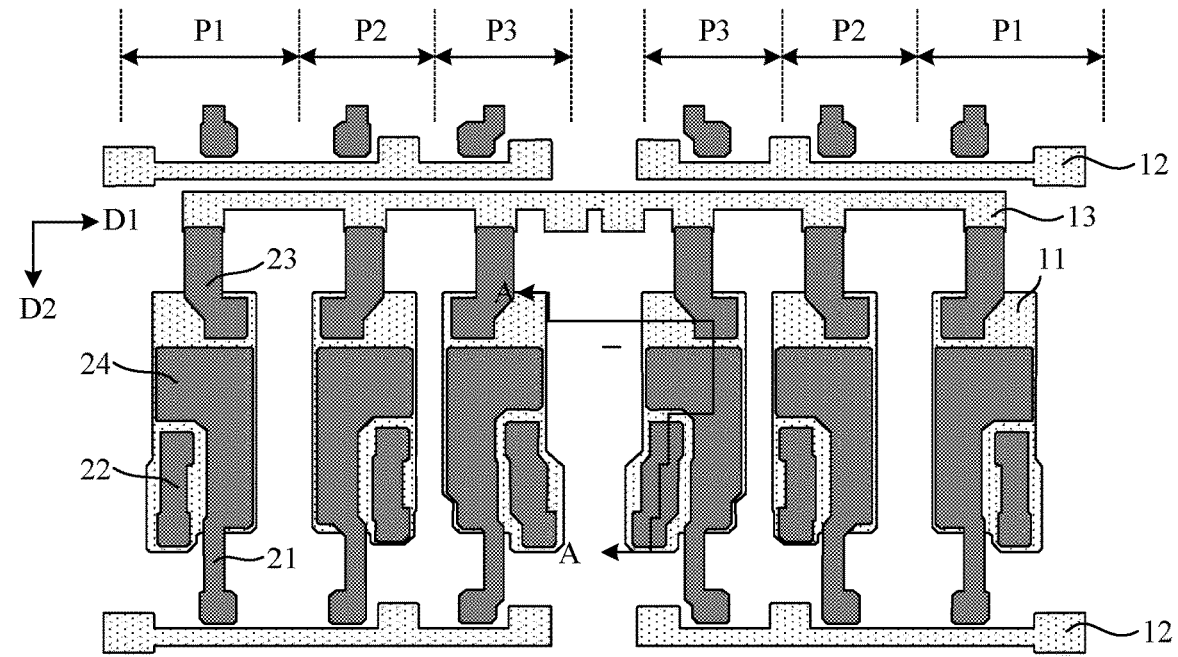
FIG. 7a is a schematic diagram after a semiconductor layer pattern is formed according to an embodiment of the present disclosure.
Figure 7B:
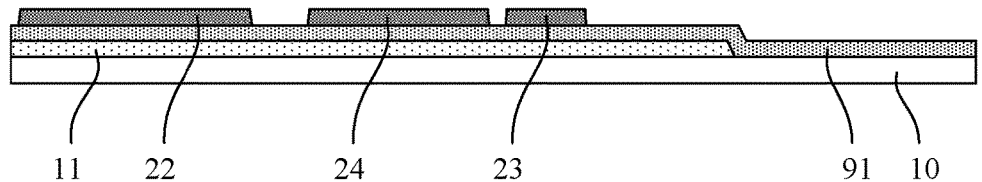

(3) A semiconductor layer pattern is formed. In an exemplary embodiment, the operation that the semiconductor layer pattern is formed may include that: a first insulation thin film and a semiconductor thin film are sequentially deposited on the base on which the foregoing patterns are formed. The semiconductor thin film is patterned through a patterning process to form a first insulation layer covering the first metal layer pattern and a semiconductor layer pattern arranged on the first insulation layer. A semiconductor layer pattern of each sub-pixel may include a first active layer 21 of a first transistor T1, a second active layer 22 of a second transistor T2, a third active layer 23 of a third transistor T3, and a first capacitor polar plate 24, as shown in FIG. 7a and FIG. 7b, and FIG. 7b is a cross-sectional view along an A-A direction in FIG. 7a.

In an exemplary embodiment, the first active layer 21, the second active layer 22, and the third active layer 23 in each sub-pixel may be of a strip shape extending along a second direction D2 and are arranged at intervals. The first capacitor polar plate 24 may be of a rectangular shape with a protrusion or a groove. The first active layer 21 and the first capacitor polar plate 24 are connected with each other to form an integrated structure. An orthographic projection of the second active layer 22 on the base is located within a range of an orthographic projection of the shielding layer 11 on the base, an orthographic projection of the first capacitor polar plate 24 on the base is located within the range of the orthographic projection of the shielding layer 11 on the base.

As shown in FIG. 6b, after the process, the display substrate includes a first conductive layer arranged on the base 10, a first insulation layer 91 covering the first conductive layer, and a semiconductor layer arranged on the first insulation layer 91. The first conductive layer at least includes a shielding layer 11. The semiconductor layer at least includes a second active layer 22, a third active layer 23, and a first capacitor polar plate 24.

Figure 8A:
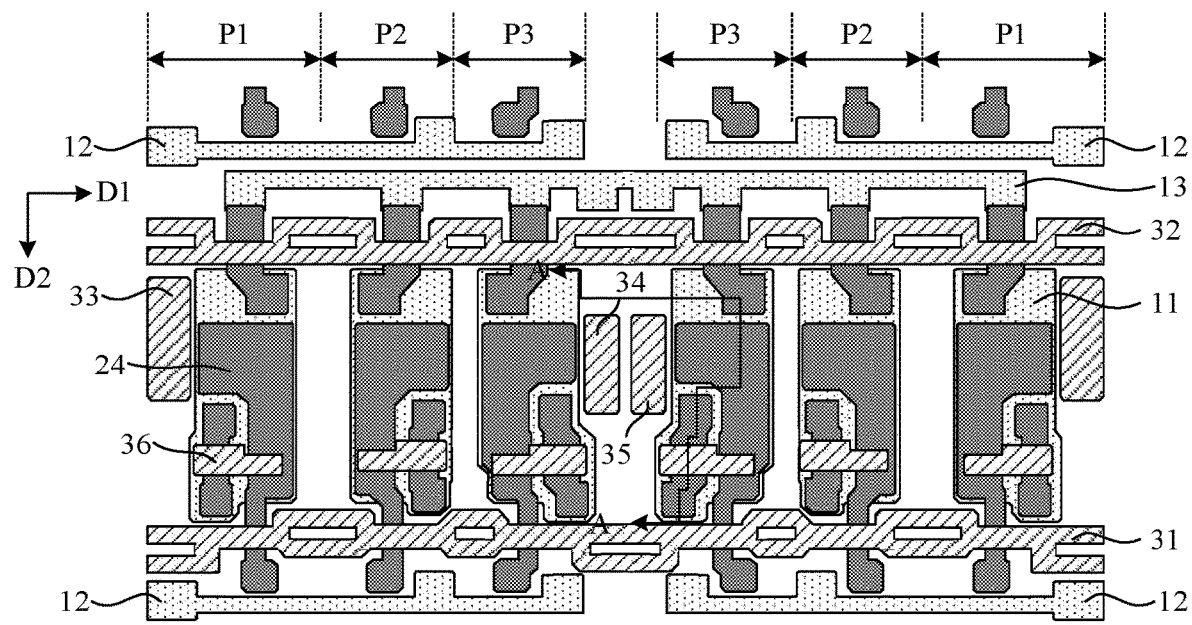
FIG. 8a is a schematic diagram after a second conductive layer pattern is formed according to an embodiment of the present disclosure.
Figure 8B:
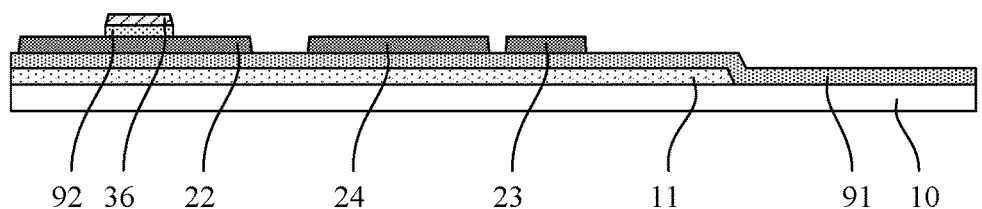

(4) A second conductive layer pattern is formed. In an exemplary embodiment, the operation that the second conductive layer pattern is formed may include that: a second insulation thin film and a second metal thin film are sequentially deposited on the base on which the foregoing patterns are formed. The second metal thin film and the second insulation thin film are patterned through a patterning process to form a second insulation layer and a second conductive layer pattern arranged on the second insulation layer. The second conductive layer pattern at least includes: a first scanning line 31, a second scanning line 32, a first protective electrode 33, a second protective electrode 34, a third protective electrode 35, and a second gate electrode 36, as shown in FIG. 8a and FIG. 8b, and FIG. 8b is a cross-sectional view along an A-A direction in FIG. 8a. In an exemplary embodiment, a second conductive layer may be called a gate metal (GATE) layer.

In an exemplary embodiment, the first scanning line 31 and the second scanning line 32 extend along the first direction D1. A region where the first scanning line 31 is overlapped with the first active layer 21 in each sub-pixel serves as a gate electrode of the first transistor T1 of the sub-pixel where the first active layer 21 is located, and a region where the second scanning line 32 is overlapped with the third active layer 23 in each sub-pixel serves as a gate electrode of the third transistor T3 of the sub-pixel where the third active layer 23 is located. In an exemplary embodiment, a region other than regions used as gate electrodes in the first scanning line 31 and the second scanning line 32 may be arranged in a double-line structure, so as to improve reliability of signal transmission.

In an exemplary embodiment, the first protective electrode 33, the second protective electrode 34, and the third protective electrode 35 are all of a strip shape extending along the second direction D2. The first protective electrode 33 may be arranged in each pixel unit and is located on one side, away from the second sub-pixel P2, of the first sub-pixel P1. The first protective electrode 33 is configured to be connected to a first power line formed subsequently. The second protective electrode 34 and the third protective electrode 35 may be arranged between third sub-pixels P3 of two adjacent pixel units. The second protective electrode 34 and the third protective electrode 35 are arranged subsequently along the first direction D1. The second protective electrode 34 is configured to be connected to the compensation line formed subsequently. The third protective electrode 35 is configured to be connected to the second power line formed subsequently.

In an exemplary embodiment, the second gate electrode 36 is of a strip shape extending along the first direction D1, and may be arranged in each sub-pixel. There is an overlapping region between an orthographic projection of the second gate electrode 36 on the base and each of the second active layer 22 and the first capacitive electrode 24.

In an exemplary embodiment, after the second conductive layer pattern is formed, a conductive treatment is performed on the semiconductor layer by taking the second conductive layer as a shield. The semiconductor layer in a region shielded by the second conductive layer forms channel regions of the first transistor T1, the second transistor T2, and the third transistor T3. The semiconductor layer in a region not shielded by the second conductive layer is conducted, that is, the first capacitor polar plate 24 and first regions and second regions of third active layers are all conducted.

As shown in FIG. 8b, after the process, the display substrate includes a first conductive layer arranged on the base 10, a first insulation layer 91 covering the first conductive layer, a semiconductor layer arranged on the first insulation layer 91, a second insulation layer 92, and a second conductive layer arranged on the second insulation layer 92. The first conductive layer at least includes a shielding layer 11. The semiconductor layer at least includes a second active layer 22, a third active layer 23, and a first capacitor polar plate 24. The second conductive layer at least includes a second gate electrode 36. In an exemplary embodiment, patterns of the second insulation layer and the second conductive layer may be substantially the same, and an orthographic projection of the second conductive layer on the base is located within a range of an orthographic projection of the second insulation layer on the base.

(5) A third layer pattern is formed. In an exemplary embodiment, the operation that the third insulation layer pattern is formed may include that: a third insulation thin film is deposited on the base on which the foregoing patterns are formed; and the third insulation thin film is patterned through a patterning process to form a third insulation layer covering the first conductive layer. A plurality of vias are formed on the third insulation layer. The plurality of vias at least include: a first via V1 to a fourteenth via V14, as shown in FIG. 9a and FIG. 9b, and FIG. 9b is a cross-sectional view along an A-A direction in FIG. 9a.

Figure 9A:
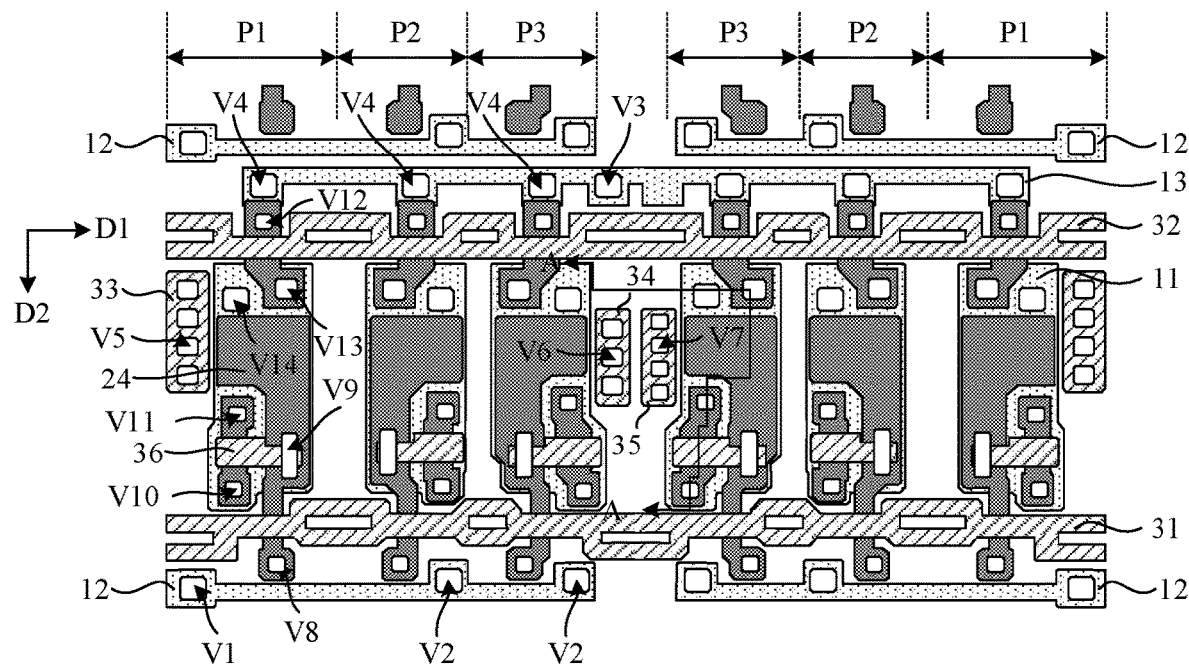
FIG. 9a is a schematic diagram after a third insulation layer pattern is formed according to an embodiment of the present disclosure.
Figure 9B:
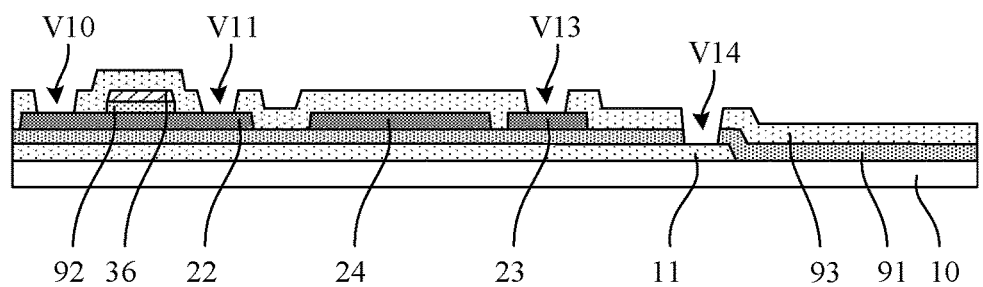

As shown in FIG. 9a, in an exemplary embodiment, the first via V1 is arranged on the power connecting line 12 of the first sub-pixel P1, and a second via V2 is arranged on each of power connecting lines 12 of the second sub-pixel P2 and the third sub-pixel P3. A third insulation layer and a first insulation layer in the first via V1 and the second via V2 are etched away, so as to expose a surface of a power connecting line 12. The first via V1 is configured to enable the first power line formed subsequently to be connected to the power connecting line 12 through the via. The second via V2 is configured to enable the first electrode of the second transistor T2 formed subsequently to be connected to the power connecting line 12 through the via.

In an exemplary embodiment, the third via V3 is arranged on a compensation connecting line 13 between adjacent third sub-pixels P3. The fourth via V4 is arranged on a compensation connecting line 13 of each sub-pixel. A third insulation layer and a first insulation layer in the third via V3 and the fourth via V4 are etched away, so as to expose a surface of a compensation connecting line 13. The third via V3 is configured to enable the compensation line formed subsequently to be connected to the compensation connecting line 13 through the via. The fourth via V4 is configured to enable the first electrode of the third transistor T3 formed subsequently to be connected to the compensation connecting line 1 through the via.

In an exemplary embodiment, a plurality of fifth vias V5 are arranged in a region where the first protective electrode 33 is located. A third insulation layer in a fifth via V5 is etched away, so as to expose a surface of the first protective electrode 33. The fifth via V5 is configured to enable the first power line formed subsequently to be connected to the first protective electrode 33 through the via. The plurality of fifth vias V5 are arranged, so that connection reliability may be improved.

In an exemplary embodiment, a plurality of sixth vias V6 are arranged in a region where the second protective electrode 34 is located. A third insulation layer in a sixth via V6 is etched away, so as to expose a surface of the second protective electrode 34. The sixth via V6 is configured to enable the compensation line formed subsequently to be connected to the second protective electrode 34 through the via. The plurality of sixth vias V6 are arranged, so that connection reliability may be improved.

In an exemplary embodiment, a plurality of seventh vias V7 are arranged in a region where the third protective electrode 35 is located. A third insulation layer in a seventh via V7 is etched away, so as to expose a surface of the third protective electrode 35. The seventh via V7 is configured to enable the second power line formed subsequently to be connected to the third protective electrode 35 through the via. The plurality of seventh vias V7 are arranged, so that connection reliability may be improved.

In an exemplary embodiment, an eighth via V8 is arranged in a region where a first region of a first active layer of each sub-pixel is located. A third insulation layer in the eighth via V8 is etched away, so as to expose a surface of the first region of the first active layer. The eighth via V8 is configured to enable the data line formed subsequently to be connected to the first region of the first active layer through the via.

In an exemplary embodiment, a ninth via V9 is arranged in a region where a first capacitor polar plate 24 and a second gate electrode 36 of each sub-pixel are located. A third insulation layer in the ninth via V9 is etched away, and the ninth via V9 exposes surfaces of the first capacitor polar plate 24 and the second gate electrode 36 simultaneously. The ninth via V9 is configured to enable the second electrode of the first transistor T1 formed subsequently (the gate electrode of the second transistor T2) to be connected to the first capacitor polar plate 24 and the second gate electrode 36 simultaneously through the via.

In an exemplary embodiment, a tenth via V10 is arranged in a region where a first region of a second active layer of each sub-pixel is located. A third insulation layer in the tenth via V10 is etched away, so as to expose a surface of the first region of the second active layer. A tenth via V10 of the first sub-pixel P1 is configured to enable the first power line formed subsequently to be connected to the first region of the second active layer through the via, and tenth vias V10 of the second sub-pixel P2 and the third sub-pixel P3 are configured to enable the first electrode of the second transistor T2 formed subsequently to be connected to the first region of the second active layer through the vias.

In an exemplary embodiment, an eleventh via V11 is arranged in a region where a second region of a second active layer of each sub-pixel is located. A third insulation layer in the eleventh via V11 is etched away, so as to expose a surface of the second region of the second active layer. The eleventh via V11 is configured to enable the second capacitor polar plate formed subsequently (the second electrode of the second transistor T2 and the second electrode of the third transistor T3) to be connected to the second region of the second active layer through the via.

In an exemplary embodiment, a twelfth via V12 is arranged in a region where a first region of a third active layer of each sub-pixel is located. A third insulation layer in the twelfth via V12 is etched away, so as to expose a surface of the first region of the third active layer. The twelfth via V12 is configured to enable the first electrode of the third transistor T3 formed subsequently to be connected to the first region of the third active layer through the via.

In an exemplary embodiment, a thirteenth via V13 is arranged in a region where a second region of a third active layer of each sub-pixel is located. A third insulation layer in the thirteenth via V13 is etched away, so as to expose a surface of the second region of the third active layer. The thirteenth via V13 is configured to enable the second capacitor polar plate formed subsequently (the second electrode of the second transistor T2 and the second electrode of the third transistor T3) to be connected to the second region of the third active layer through the via.

In an exemplary embodiment, a fourteenth via V14 is arranged in a region where a shielding layer 11 of each sub-pixel is located. A third insulation layer and a first insulation layer in the fourteenth via V14 are etched away, so as to expose a surface of the shielding layer 11. The fourteenth via V14 is configured to enable the second capacitor polar plate formed subsequently (the second electrode of the second transistor T2 and the second electrode of the third transistor T3) to be connected to the shielding layer 11 through the via.

As shown in FIG. 9b, after the process, the display substrate includes a first conductive layer arranged on the base 10, a first insulation layer 91 covering the first conductive layer, a semiconductor layer arranged on the first insulation layer 91, a second insulation layer 92, a second conductive layer arranged on the second insulation layer 92, and a third insulation layer 93 covering the second conductive layer. The first conductive layer at least includes a shielding layer 11. The semiconductor layer at least includes a second active layer 22, a third active layer 23, and a first capacitor polar plate 24. The second conductive layer at least includes a second gate electrode 36. A plurality of vias are arranged on the third insulation layer 93. The plurality of vias at least include: a tenth via V10, an eleventh via V11, a thirteenth via V13, and a fourth via V14.

Figure 10A:
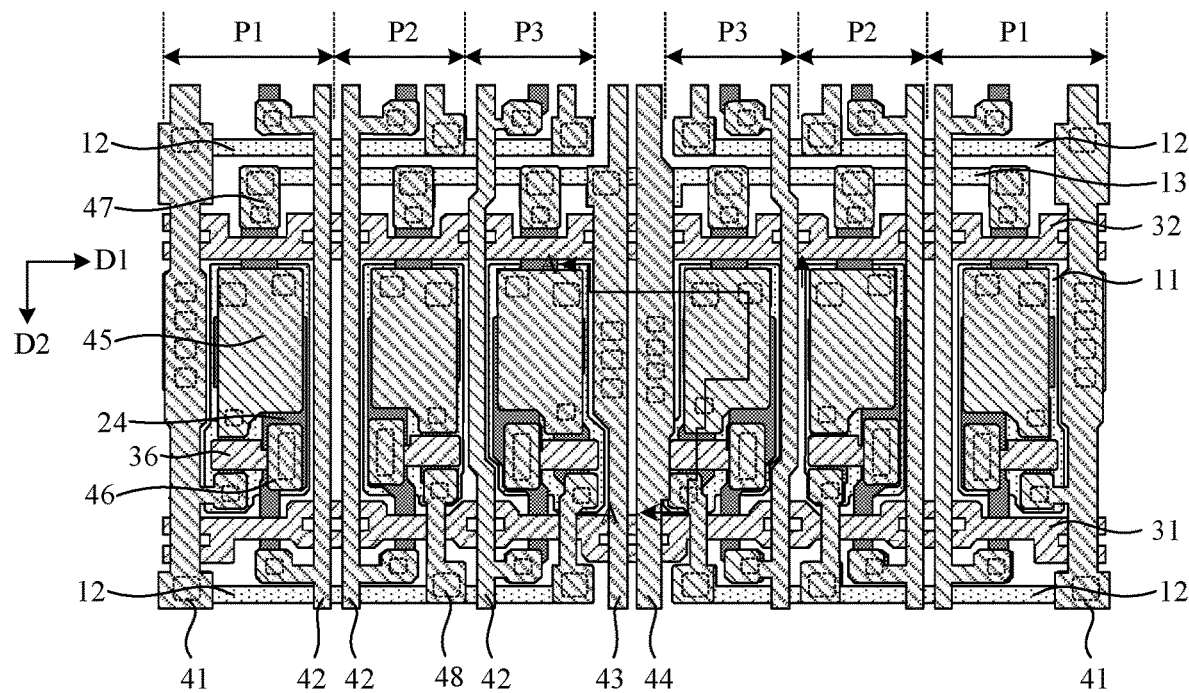
FIG. 10a is a schematic diagram after a third conductive layer pattern is formed according to an embodiment of the present disclosure.
Figure 10B:
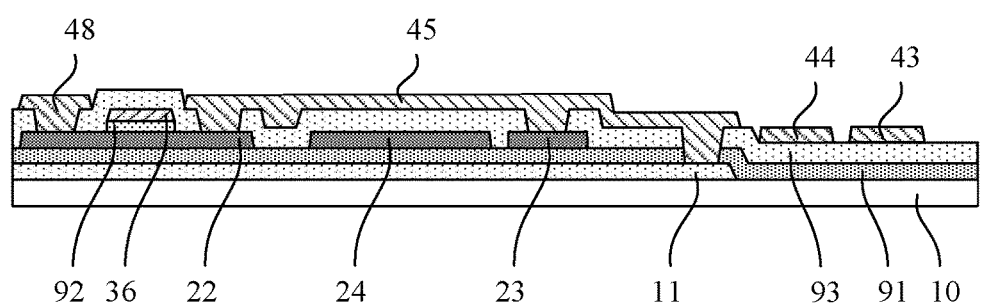

(6) A third conductive layer pattern is formed. In an exemplary embodiment, the operation that the third conductive layer pattern is formed may include that: a third metal thin film is deposited on the base on which the foregoing patterns are formed. The third metal thin film is patterned through a patterning process to form a third conductive layer arranged on the third insulation layer. The third conductive layer at least includes: a first power line 41, a data line 42, a compensation line 43, a second power line 44, a second capacitor polar plate 45, a first connecting electrode 46, a second connecting electrode 47, and a third connecting electrode 48, as shown in FIG. 10a and FIG. 10b, and FIG. 10b is a cross-sectional view along an A-A direction in FIG. 10a. In an exemplary embodiment, the third conductive layer may be called a Source-Drain metal (SD) layer.

As shown in FIG. 10a, in an exemplary embodiment, a first power line 41 is arranged in each pixel unit, and is located on one side, away from the second sub-pixel P2, of the first sub-pixel P1. The first power line 41 extends along the second direction D2. The first power line 41, in one aspect, is connected to the power connecting line 12 through a first via V1, in another aspect, is connected to the first protective electrode 33 through a plurality of fifth vias V5, in yet another aspect, is connected to a first region of a second active layer of the first sub-pixel P1 through a tenth via V10, so that a high-level signal transmitted by the first power line 41 is written into the first electrode of the second transistor T2.

In an exemplary embodiment, a data line 42 is arranged in each sub-pixel, the data line 42 extends along the second direction D2, and is connected to the first region of the first active layer via an eighth via V8, so that a data signal transmitted by the data line 42 is written into a first transistor T1 of each sub-pixel. In an exemplary embodiment, a data line 42 in the second sub-pixel P2 is arranged close to a data line 42 in the third sub-pixel P3.

In an exemplary embodiment, the compensation line 43 is arranged between third sub-pixels P3 of two adjacent pixel units. The compensation line 43 extends along the second direction D2, in one aspect, is connected to the second protective electrode 34 through a plurality of sixth vias V6, in the other aspect, is connected to the compensation connecting line 13 through a third via V3, so that a compensation signal transmitted by the compensation line 43 is written into a third transistor T3 of each sub-pixel through the compensation connecting line 13.

In an exemplary embodiment, the second power line 44 is arranged between third sub-pixels P3 of two adjacent pixel units. The second power line 44 extends along the second direction D2, and is connected to the third protective electrode 35 through a plurality of seventh vias V7.

In an exemplary embodiment, the second capacitor polar plate 45 is arranged in each sub-pixel, and the second capacitor polar plate 45, in one aspect, is connected to the second region of the second active layer via the eleventh via V11, in an another aspect, is connected to the second region of the third active layer via the thirteenth via V13, and in yet another aspect, is connected to the shielding layer 11 via the fourteenth via V14. In an exemplary embodiment, an orthographic projection of the second capacitor polar plate 45 on the base is overlapped with an orthographic projection of the first capacitor polar plate 24 on the base. The second capacitor polar plate 45 and the first capacitor polar plate 24 form a first storage capacitor. Since the second capacitor polar plate 45 is connected to the shielding layer 11 and the two have a same potential, the shielding layer 11 and the first capacitor polar plate 24 form a second storage capacitor, and a first storage capacitor and a second storage capacitor that are connected in parallel are formed in each sub-pixel, which effectively increases capacity of a storage capacitor of each sub-pixel. In an exemplary embodiment, the second capacitor polar plate 45 may serve as the second electrode of the second transistor T2 and the second electrode of the third transistor T3 simultaneously, so that the second capacitor polar plate 45, the second electrode of the second transistor T2, and the second electrode of the third transistor T3 have a same potential.

In an exemplary embodiment, the first connecting electrode 46 is arranged in each sub-pixel. The first connecting electrode 46 is connected to the first capacitor polar plate 24 and the second gate electrode 36 simultaneously through the ninth via V9. In an exemplary embodiment, the first connecting electrode 46 may serve as the second electrode of the first transistor T1, so that the gate electrode of the second transistor T2, the second electrode of the first transistor T1, and the first capacitor polar plate 24 have a same potential.

In an exemplary embodiment, the second connecting electrode 47 is arranged in each sub-pixel, and the second connecting electrode 47, in one aspect, is connected to the compensation connecting line 13 through the fourth via V4, and in another aspect, is connected to the first region of the third active layer through the twelfth via V12. In an exemplary embodiment, the second connecting electrode 47 may serve as the first electrode of the third transistor T3, so that a compensation signal transmitted by the compensation line 43 is written into a third transistor T3 of each sub-pixel through the compensation connecting line 13.

In an exemplary embodiment, the third connecting electrode 48 is arranged in a second sub-pixel P2 and a third sub-pixel P3 of each sub-pixel unit. The third connecting electrode 48, in one aspect, is connected to the power connecting line 12 through the second via V2, and in another aspect, is connected to the first region of the second active layer through the tenth via V10. In an exemplary embodiment, the third connecting electrode 48 may serve as the first electrode of the second transistor T2, so that a high-level signal transmitted by the first power line 41 is written into the first electrode of the second transistor T2 through the power connecting line 12.

As shown in FIG. 10b, after the process, the display substrate includes a first conductive layer arranged on the base 10, a first insulation layer 91 covering the first conductive layer, a semiconductor layer arranged on the first insulation layer 91, a second insulation layer 92, a second conductive layer arranged on the second insulation layer 92, a third insulation layer 93 covering the second conductive layer, and a third conductive layer arranged on the third insulation layer 93. The first conductive layer at least includes a shielding layer 11. The semiconductor layer at least includes a second active layer 22, a third active layer 23, and a first capacitor polar plate 24. The second conductive layer at least includes a second gate electrode 36. A plurality of vias are arranged on the third insulation layer 93. The plurality of vias at least include: a tenth via V10, an eleventh via V11, a thirteenth via V13, and a fourth via V14. The third conductive layer at least includes a compensation line 43, a second power line 44, a second capacitor polar plate 45, and a third connecting electrode 48. The third connecting electrode 48 is connected to the second active layer 22 through the tenth via V10. The second capacitor polar plate 45 is connected to the second active layer 22, the third active layer 23, and the shielding layer 11 through the eleventh via V11, the thirteenth via V13, and the fourth via V14 respectively.

(7) Patterns of a fourth insulation layer and a first planarization layer are formed. In an exemplary embodiment, the operation that the patterns of the fourth insulation layer and the first planarization layer are formed may include that: first, a first insulation thin film is deposited on the base on which the foregoing patterns are formed; then, a planarization thin film is coated; the planarization thin film and the fourth insulation thin film are patterned through a patterning process, so as to form a fourth insulation layer covering the third conductive layer and a planarization layer arranged on the fourth insulation layer; and patterns of an anode via K1 and an electrode via K2 are formed on the fourth insulation layer and the planarization layer, as shown in FIG. 11*a* and FIG. 11*b*, and FIG. 11*b* is a cross-sectional view along an A-A direction in FIG. 11*a*.

Figure 11A:
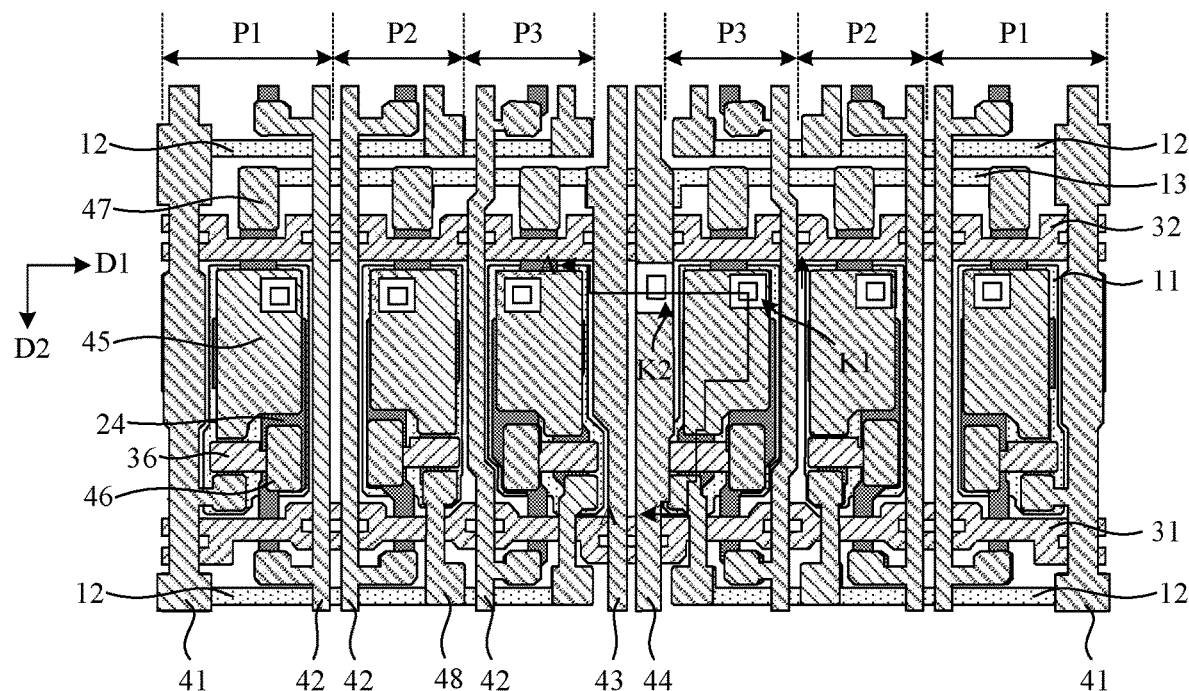
FIG. 11a is a schematic diagram after a first planarization layer pattern is formed according to an embodiment of the present disclosure.

As shown in FIG. 11*a*, in an exemplary embodiment, an anode via K1 is arranged in each sub-pixel. A planarization layer and a fourth insulation layer in the anode via K1 are removed, so as to expose a surface of the second capacitor polar plate 45. An electrode via K2 is formed between third sub-pixels P3 of two adjacent pixel units. A planarization layer and a fourth insulation layer in the electrode via K2 are removed, so as to expose a surface of the second power line 44.

In an exemplary embodiment, each of the anode via K1 and the electrode via K2 may include a large hole arranged on the planarization layer 95 and a small hole arranged on the fourth insulation layer 94, and the small hole is arranged in the large hole.

Figure 11B:
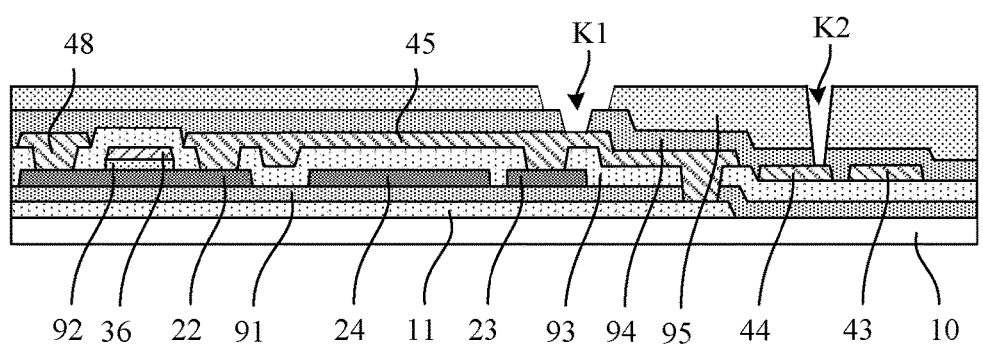

As shown in FIG. 11*b*, after the process, the display substrate includes a first conductive layer arranged on the base 10, a first insulation layer 91 covering the first conductive layer, a semiconductor layer arranged on the first insulation layer 91, a second insulation layer 92, a second conductive layer arranged on the second insulation layer 92, a third insulation layer 93 covering the second conductive layer, a third conductive layer arranged on the third insulation layer 93, a fourth insulation layer 94 covering the third insulation layer 93, and a planarization layer 95 covering the fourth insulation layer 94. An anode via K1 and an electrode via K2 are arranged on the fourth insulation layer 94 and the planarization layer 95, and the anode via K1 exposes the second capacitor polar plate 45, and the electrode via K2 exposes the second power line 44.

Thus, a pattern of a driving circuit layer is prepared and completed on the base. In an exemplary embodiment, a driving circuit layer of each sub-pixel at least includes a first transistor T1, a second transistor T2, a third transistor T3, and a storage capacitor.

In an exemplary embodiment, the first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a plurality of layers, or a composite layer. The first insulation layer is called a Buffer layer. The second insulation layer is called a Gate Insulation (GI) layer. The third insulation layer is called an Interlayer Insulation (ILD) layer. The fourth insulation layer is called a Passivation (PVX) layer. The planarization thin film may be made of an organic material such as resin. The first metal thin film, the second metal thin film, and the third metal thin film may be made of a metal material such as any one or more of Argentum (Ag), Copper (Cu), Aluminum (Al), Titanium (Ti), and Molybdenum (Mo), or an alloy material of the abovementioned metals, such as an Aluminum-Neodymium alloy (AlNd) or a Molybdenum-Niobium alloy (MoNb), and may be of a single-layer structure, or a multilayer composite structure, such as Ti/Al/Ti. The semiconductor thin film may be made of various materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), sexithiophene, and polythiophene. That is, the present disclosure is applied to a transistor manufactured on a basis of an Oxide technology, a silicon technology, or an organic matter technology.

Figure 12A:
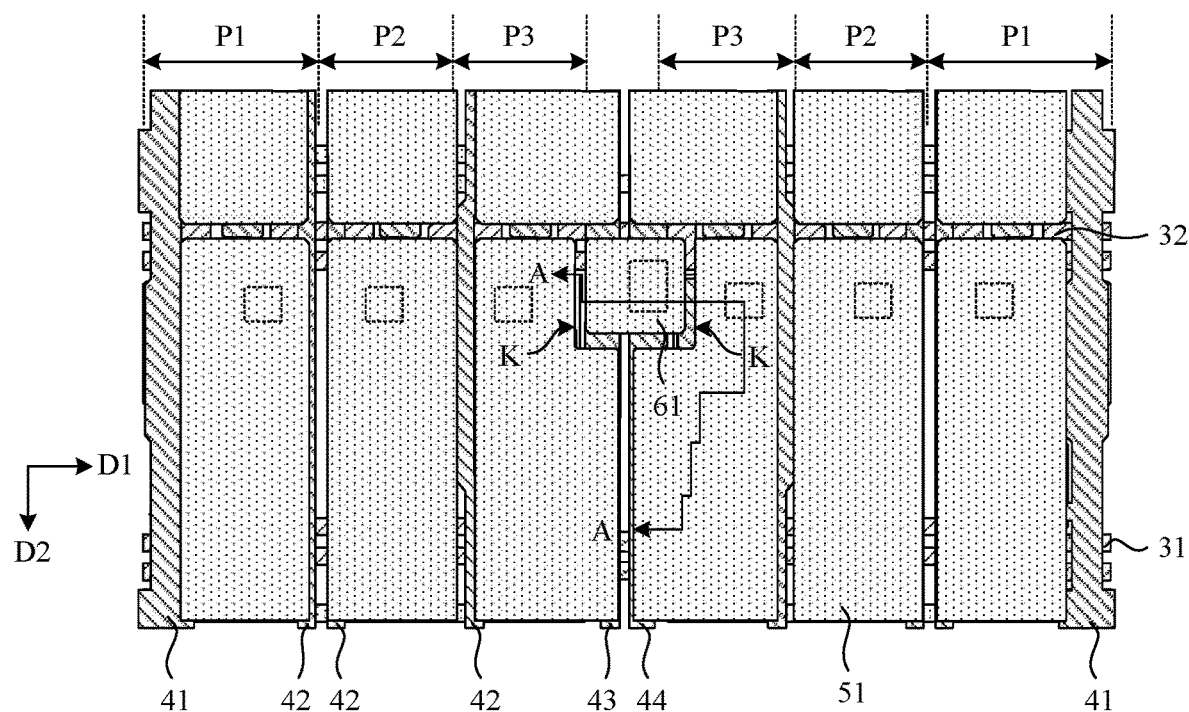
FIG. 12a is a schematic diagram after a first transparent conductive layer pattern is formed according to an embodiment of the present disclosure.
Figure 12B:
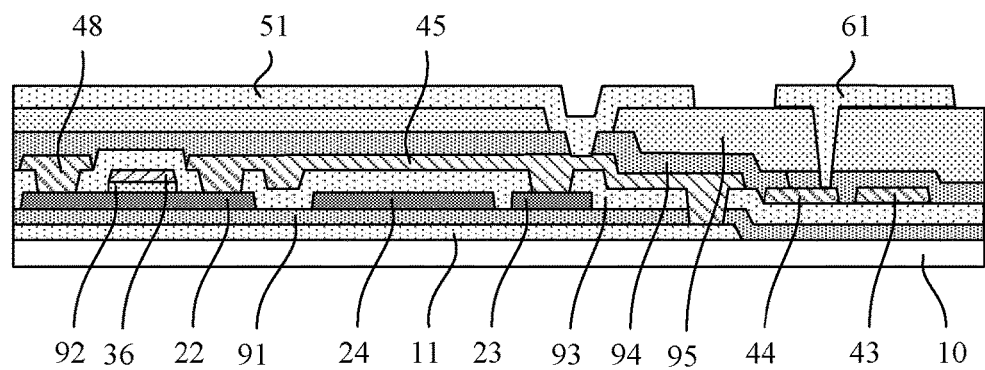

(8) A first transparent conductive layer pattern is formed. In an exemplary embodiment, the operation that a first transparent conductive layer pattern is formed may include that: a first transparent conductive thin film is deposited on the base on which foregoing patterns are formed; and the first transparent conductive thin film is patterned through a patterning process, so as to form the first transparent conductive layer pattern. The first transparent conductive layer pattern at least includes a first anode 51 and a first auxiliary electrode 61, as shown in FIG. 12*a* and FIG. 12*b*, FIG. 12*b* is a cross-sectional view along an A-A direction in FIG. 12*a*.

In an exemplary embodiment, the first anode 51 is arranged on the planarization layer and is connected to the second capacitor polar plate through the anode via K1. The first auxiliary electrode 61 is arranged on the planarization layer and is connected to the second power line 44 through the electrode via K2.

In an exemplary embodiment, the first transparent conductive thin film may be made of Indium Tin Oxide (ITO), or Indium Zinc Oxide (IZO), etc.

In an exemplary embodiment, in a plane parallel to the display substrate, a shape of the first auxiliary electrode may be any one or more of following: a triangle, a rectangle, a trapezoid, a polygon, a circle, and an ellipse. An edge of the triangle, the rectangle, the trapezoid, and the polygon may be a straight line or a curved line. A corner of the first auxiliary electrode may be set as an arc-shaped chamfer, which is not limited in the present disclosure herein.

In an exemplary embodiment, in a plane parallel to the display substrate, the display substrate may include a plurality of pixel units. The plurality of pixel units are respectively arranged along the first direction D1 and the second direction D2 sequentially. The first auxiliary electrode 61 may be arranged between two adjacent pixel units in the first direction D1, so that a plurality of sub-pixels in the two pixel units share one auxiliary electrode.

In an exemplary embodiment, in two adjacent pixel units, a first pixel unit may include a first sub-pixel P1, a second sub-pixel P2, and a third sub-pixel P3 that are arranged sequentially along the first direction D1, and a second pixel unit may include a first sub-pixel P1, a second sub-pixel P2, and a third sub-pixel P3 that are arranged sequentially along an opposite direction of the first direction D1, that is, third sub-pixels P3 of the two pixel units are adjacent in the first direction D1. In an exemplary embodiment, the first auxiliary electrode 61 may be arranged between two adjacent third sub-pixels P3.

In an exemplary embodiment, a shape of a first anode in a first sub-pixel P1 and a second sub-pixel P2 in two pixel units may be a rectangle, which is similar to a shape of a sub-pixel where the first anode is located.

In an exemplary embodiment, in the second direction D2, a first anode of the third sub-pixel P3 in the first pixel unit (left side) has a first end and a second end, and a dimension of the first end in the first direction D1 is less than that of the second end in the first direction D1. In the first direction D1, a distance between the second end and the second pixel unit is less than that between the first end and the second pixel unit.

In an exemplary embodiment, in the second direction D2, a first anode of the third sub-pixel P3 in the second pixel unit (right side) has a third end and a fourth end, and a dimension of the third end in the first direction D1 is less than that of the fourth end in the first direction D1. In the first direction D1, a distance between the fourth end and the first pixel unit is less than that between the third end and the first pixel unit.

In an exemplary embodiment, the first auxiliary electrode 61 is arranged between the first end and the third end.

A shape of a first anode of a third sub-pixel P3 in two pixel units may be a rectangle with a groove K. The rectangle is similar to a shape of the third sub-pixel P3. The groove K is arranged on one side, close to the first auxiliary electrode 61, of the first anode 51.

In an exemplary embodiment, the third sub-pixel P3 of the first pixel unit (left side) includes a first anode with a first groove. The third sub-pixel P3 of the second pixel unit (right side) includes a first anode with a second groove. The first auxiliary electrode is arranged between the first anode with the first groove and the first anode with the second groove.

In an exemplary embodiment, in the third sub-pixel P3 of the first pixel unit (left side), the first groove is arranged on one side, close to the second pixel unit, of the first anode. In the third sub-pixel P3 of the second pixel unit (right side), the second groove is arranged on one side, close to the first pixel unit, of the first anode, so that an accommodating region is formed between adjacent third sub-pixels P3 of two pixel units, and the first auxiliary electrode 61 is arranged in the accommodating region.

As shown in FIG. 12b, after the process, the display substrate includes a first conductive layer arranged on the base 10, a first insulation layer 91 covering the first conductive layer, a semiconductor layer arranged on the first insulation layer 91, a second insulation layer 92, a second conductive layer arranged on the second insulation layer 92, a third insulation layer 93 covering the second conductive layer, a third conductive layer arranged on the third insulation layer 93, a fourth insulation layer 94 covering the third insulation layer 93, a planarization layer 95 covering the fourth insulation layer 94, and a first transparent conductive layer arranged on the planarization layer 95. The first transparent conductive layer at least includes a first anode 51 and a first auxiliary electrode 61. The first anode 51 is connected to the second capacitor polar plate 45 through the anode via K1. The first auxiliary electrode 61 is connected to the second power line 44 through the electrode via K2.

(9) Patterns of an anode and an auxiliary electrode are formed. In an exemplary embodiment, the operation that the patterns of the anode and the auxiliary electrode are formed may include: a fourth metal thin film and a second transparent conductive thin film are sequentially deposited on the base on which the foregoing patterns are formed. The fourth metal thin film and the second transparent conductive thin film are patterned through a patterning process, so as to form patterns of a second anode 52, a third anode 53, a second auxiliary electrode 62, and a third auxiliary electrode 63. The second anode 52 is arranged on one side, away from the base, of the first anode 51, and is connected to the first anode 51. The third anode 53 is arranged on one side, away from the base, of the second anode 52, and is connected to the second anode 52. The second auxiliary electrode 62 is arranged on one side, away from the base, of the first auxiliary electrode 61, and is connected to the first auxiliary electrode 61. The third auxiliary electrode 63 is arranged on one side, away from the base, of the second auxiliary electrode 62, and is connected to the second auxiliary electrode 62. The first anode 51, the second anode 52, and the third anode 53 that are stacked form an anode 50, and the first auxiliary electrode 61, the second auxiliary electrode 62, and the third auxiliary electrode 63 that are stacked form an auxiliary electrode 60, as shown in FIG. 13.

In an exemplary embodiment, in a plane parallel to the display substrate, shapes of the second anode 52 and the third anode 53 are similar to a shape of the first anode 51. An orthographic projection of the second anode 52 on the base may be located within a range of an orthographic projection of the first anode 51 on the base. An orthographic projection of the second anode 52 on the base may be located within a range of an orthographic projection of the third anode 53 on the base. In a plane parallel to the display substrate, shapes of the second auxiliary electrode 62 and the third auxiliary electrode 63 are similar to a shape of the first auxiliary electrode 61. An orthographic projection of the second auxiliary electrode 62 on the base is located within a range of an orthographic projection of the first auxiliary electrode 61 on the base. An orthographic projection of the second auxiliary electrode 62 on the base may be located within a range of an orthographic projection of the third auxiliary electrode 63 on the base.

Figure 13:
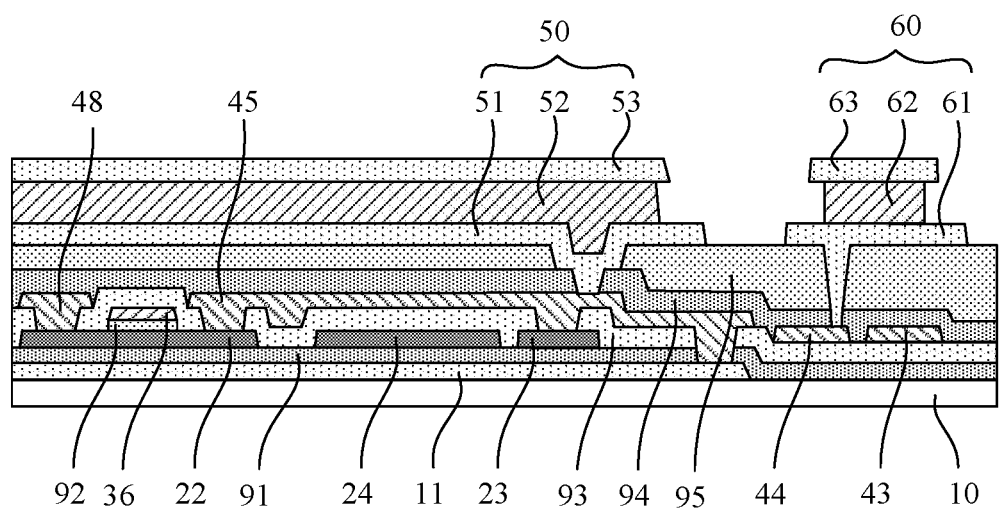
FIG. 13 is a schematic diagram after patterns of an anode and an auxiliary electrode are formed according to an embodiment of the present disclosure.
Figure 14:
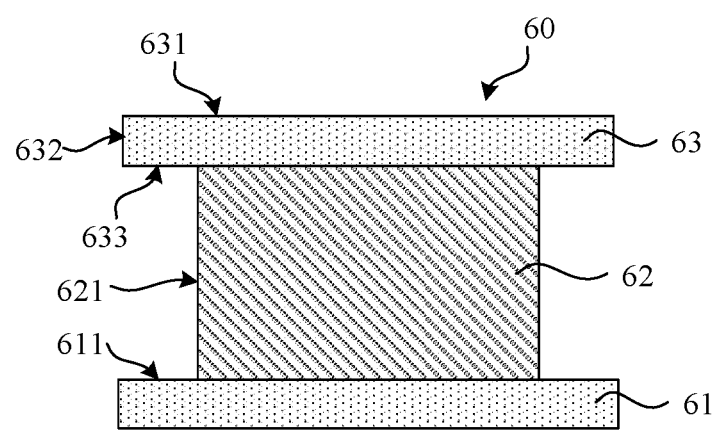
FIG. 14 is a schematic diagram of a cross-section of an auxiliary electrode according to an embodiment of the present disclosure.

FIG. 14 is a schematic diagram of a cross-section of an auxiliary electrode according to an embodiment of the present disclosure, which is an enlarged diagram of an auxiliary electrode in FIG. 13. As shown in FIG. 14, in a plane perpendicular to the display substrate, the first auxiliary electrode 61 located on one side (lower side), close to the base, of the second auxiliary electrode 62 has an edge protruding from a profile of the second auxiliary electrode 62, so as to from a structure of a "building seat". The third auxiliary electrode 63 located on one side (upper side), away from the base, of the second auxiliary electrode 62 has an edge protruding from the profile of the second auxiliary electrode 62, and the first auxiliary electrode 61 and the third auxiliary electrode 63 form a structure of an "eave", so that the first auxiliary electrode 61, the second auxiliary electrode 62, and the third auxiliary electrode 63 that are stacked form a shape like the Chinese character "工".

In an exemplary embodiment, the first anode 51 located on one side (lower side), close to the base, of the second anode 52 has an edge protruding from a profile of the second anode 52, so as to from a structure of a "building seat". The third anode 53 located on one side (upper side), away from the base, of the second anode 52 has an edge protruding from the profile of the second anode 52, so as to form a structure of an "eave", so that the first anode 51, the second anode 52, and the third anode 53 that are stacked form a shape like the Chinese character "工".

In an exemplary embodiment, during the patterning of the fourth metal thin film and the second transparent conductive thin film, a first etching liquid and a second etching liquid may be used for performing etching respectively, and structures like the Chinese character " 工 " of an auxiliary electrode and an anode are formed by drilling. In an exemplary embodiment, the first etching liquid may use an etching liquid (ITO etching liquid) for etching a transparent conductive material, and the second etching liquid may use an etching liquid (Metal etching liquid) for etching a metal material. In an exemplary embodiment, after a photoresist pattern is formed through masking, exposing, and developing of a photoresist, an etching process may include that: the second transparent conductive thin film which is not covered by the photoresist is etched with the ITO etching liquid first, so that a region that is not covered by the photoresist exposes the fourth metal thin film, and patterns of the third anode 53 and the third auxiliary electrode 63 are formed. Then, the exposed fourth metal thin film is etched with the Metal etching liquid, so as to form patterns of the second anode 52 and the second auxiliary electrode 62. Since a rate at which the fourth metal thin film is etched with the Metal etching liquid is greater than a rate at which the first transparent conductive thin film and the second transparent conductive thin film are etched, side surfaces of the second anode 52 and the second auxiliary electrode 62 are etched into pits. The first anode 51 below the second anode 52 and the third anode 53 above the second anode 52 both protrude from the second anode 52 by a distance, and the first auxiliary electrode 61 below the second auxiliary electrode 62 and the third auxiliary electrode 63 above the second auxiliary electrode 62 protrude from the second auxiliary electrode 62 by a distance, so as to form a structure like the Chinese character " 工 ".

As shown in FIG. 14, in a plane perpendicular to the display substrate, the formed auxiliary electrode has a plurality of exposed surfaces. These exposed surfaces respectively include: a first upper surface 611 which is a surface, away from the base, of a part of the first auxiliary electrode 61 protruding from the second auxiliary electrode 62, a second side surface 621 of a side part of the second auxiliary electrode 62, a third upper surface 631 on an upper side (a side away from the base) of the third auxiliary electrode 63, a third side surface 632 of a side part of the third auxiliary electrode 63, and a third bottom surface 633 on a lower side (a side close to the base) of the third auxiliary electrode 63. The third bottom surface 633 refers to a surface, close to the base, of a part of the third auxiliary electrode 63 protruding from the second auxiliary electrode 62. In an exemplary embodiment, the foregoing side surfaces refer to a plurality of circumferential surfaces having normal directions parallel or nearly parallel to a plane of the base. For example, in a plane parallel to the base, a second side surface 621 of a rectangular second auxiliary electrode 62 includes four circumferential surfaces.

In an exemplary embodiment, a material of the fourth metal thin film may include one or more of Argentum (Ag), Copper (Cu), Aluminum (Al), Titanium (Ti), and Molybdenum (Mo), or an alloy material of the abovementioned metals. A material of the second transparent conductive may be Indium Tin Oxide (ITO), or Indium Zinc Oxide (IZO), or the like.

Figure 15A:
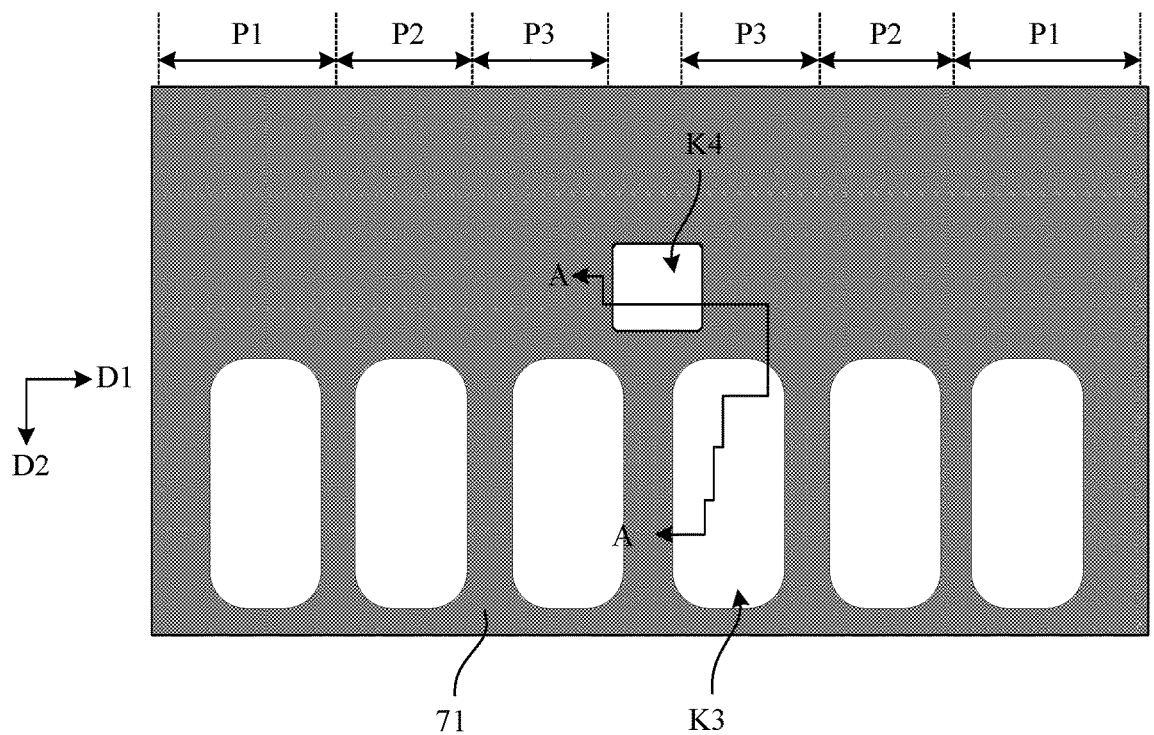
FIG. 15a and FIG. 15b are schematic diagrams after a pixel definition layer pattern is formed according to an embodiment of the present disclosure.
Figure 15B:
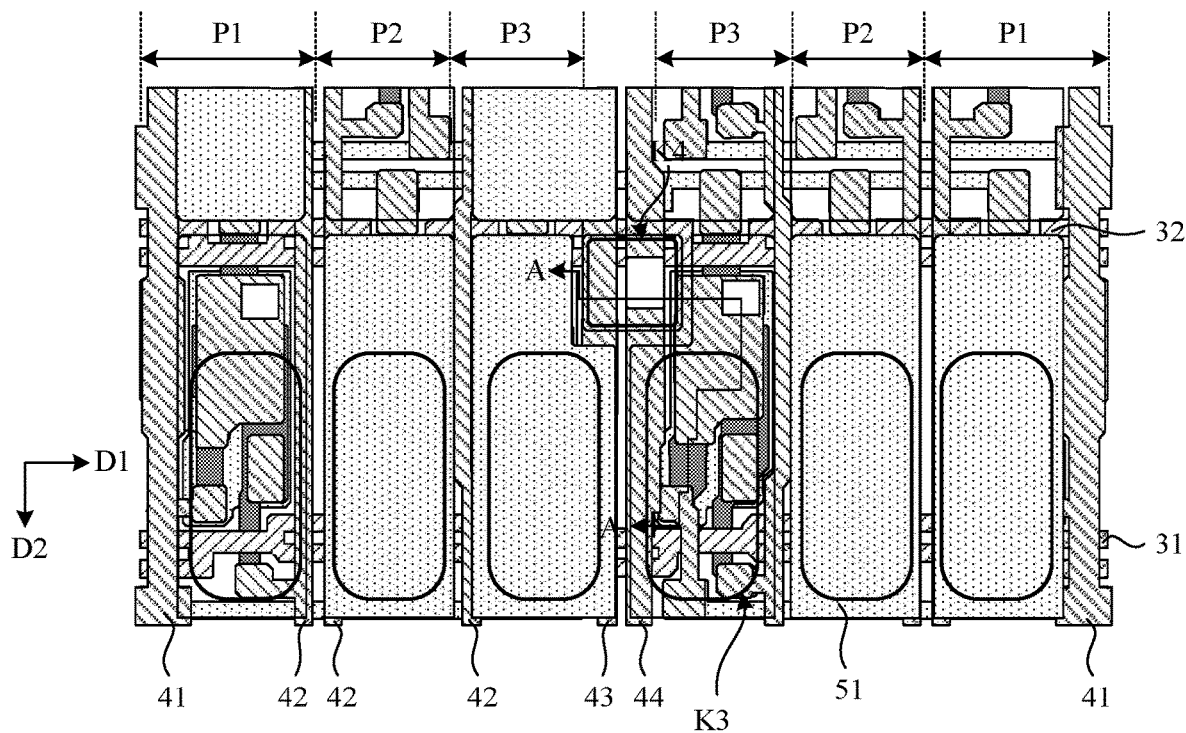
Figure 15C:
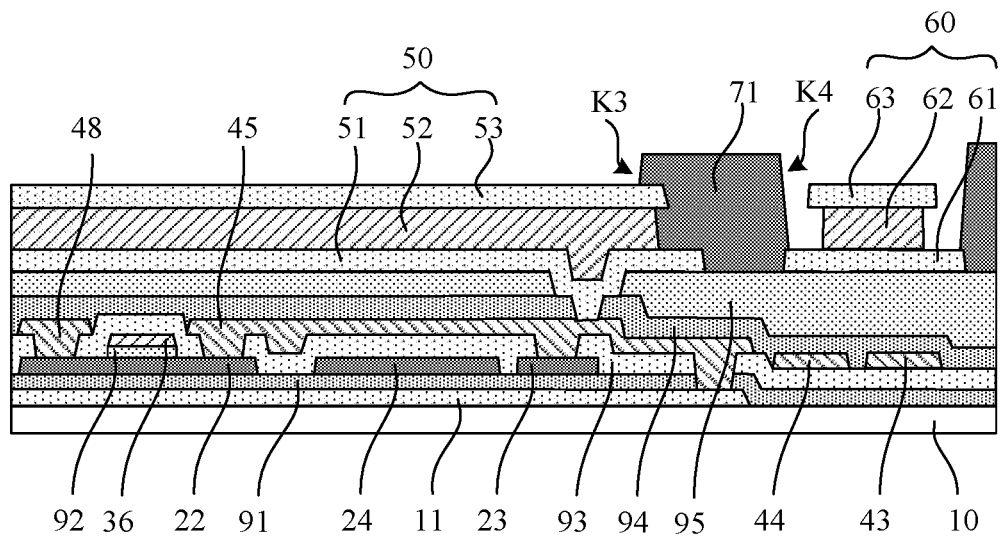
FIG. 15c is a cross-sectional view along an A-A direction in FIG. 15a and FIG. 15b.

(10) A pixel definition layer pattern is formed. In an exemplary embodiment, the operation that the pixel definition layer pattern is formed may include that: a pixel definition thin film is coated on the base on which the foregoing patterns are formed; the pixel definition thin film is patterned through a patterning process, so as to form a pattern of a Pixel Definition Layer (PDL) 71. A first pixel opening K3 and a second pixel opening K4 are formed in the pixel definition layer 71. The pixel definition layer 71 in the first pixel opening K3 is removed to expose a part of a surface of the third anode 53 in an anode. The pixel definition layer 71 in the second pixel opening K4 is removed to expose all surfaces of the second auxiliary electrode 62 and the third auxiliary electrode 63 in an auxiliary electrode, as shown in FIG. 15a, FIG. 15b, and FIG. 15c. FIG. 15a is a schematic diagram of a shape of a pixel opening in a pixel definition layer, FIG. 15b is a schematic diagram of a position of the pixel opening in the pixel definition layer, and the pixel definition layer is set to be transparent. And FIG. 15c is a cross-sectional view along an A-A direction in FIG. 15a and FIG. 15b.

In an exemplary embodiment, an orthographic projection of the first pixel opening K3 on the base is located within a range of an orthographic projection of the third anode 53 on the base. An orthographic projection of the second pixel opening K4 on the base is located within a range of an orthographic projection of the first auxiliary electrode 61 on the base. Orthographic projections of the second auxiliary electrode 62 and the third auxiliary electrode 63 on the base are within a range of the orthographic projection of the second pixel opening K4 on the base. The second pixel opening K4 exposing all surfaces of the second auxiliary electrode 62 and the third auxiliary electrode 63 refers to that the second pixel opening has a second lower opening on a side close to the base and a second upper opening on a side away from the base. The orthographic projections of the second auxiliary electrode 62 and the third auxiliary electrode 63 on the base are within a range of an orthographic projection of the second lower opening on the base.

In an exemplary embodiment, the pixel definition layer may be made of Polyimide, Acrylics, or Polyethylene Glycol Terephthalate, etc. In a plane parallel to the display substrate, a shape of the first pixel opening K3 may be an ellipse, and a shape of the second pixel opening K4 may be a rectangle. In a plane perpendicular to the display substrate, cross-sectional shapes of the first pixel opening K3 and the second pixel opening K4 may be rectangles, or trapezoids, etc.

Figure 16:
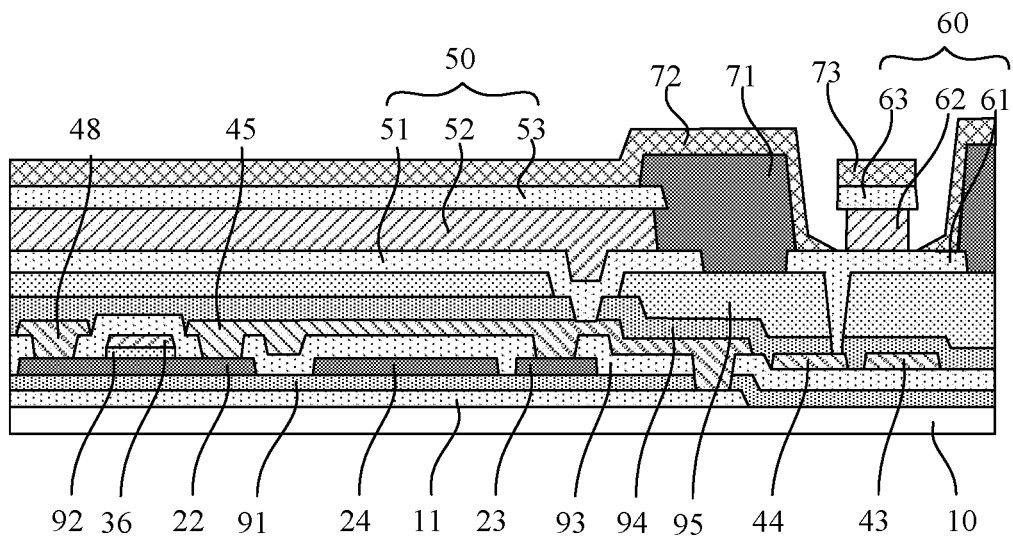
FIG. 16 is a schematic diagram after an organic light emitting layer pattern is formed according to an embodiment of the present disclosure.

(11) An organic light emitting layer pattern is formed. In an exemplary embodiment, the operation that the organic light emitting layer pattern is formed may include that: an organic light emitting material is evaporated on the base on which the foregoing patterns are formed, so as to form patterns of an organic light emitting layer 72 and an organic light emitting block 73. The organic light emitting layer 72 is arranged in a region other than the third auxiliary electrode 63. The organic light emitting layer 72 is connected to the third anode 53 in the anode 50 through the first pixel opening K3. The organic light emitting block 73 is arranged on a surface of the third auxiliary electrode 63 away from the base. The organic light emitting block 73 is isolated from the organic light emitting layer 72, as shown in FIG. 16.

In an exemplary embodiment, due to a structure like the Chinese character " 工 " of an auxiliary electrode, the third auxiliary electrode 63 protrudes from the second auxiliary electrode 62 by a distance, so that an organic light emitting material is cut off at an edge of a side surface of the third auxiliary electrode 63, the organic light emitting block 73 is formed on the second upper surface 631 of the third auxiliary electrode 63, and the organic light emitting layer 72 is formed in a region other than the third auxiliary electrode 63, so that mutual isolation of the organic light emitting layer 72 and the organic light emitting block 73 is achieved. In an exemplary embodiment, an orthographic projection of the organic light emitting block 73 on the base may be approximately equal to an orthographic projection of the third auxiliary electrode 63 on the base. The organic light emitting layer is isolated and cut off through an auxiliary electrode of a structure like the Chinese character " 工 ", so as to form isolated and separated organic light emitting blocks, which effectively avoids interference of the organic light emitting blocks on emergent light, improves quality of emergent light, and is beneficial to improving display quality.

In an exemplary embodiment, the organic light emitting layer 72 is connected to the third anode 53 through the first pixel opening K3, so that a connection of the organic light emitting layer 72 and the anode 50 is achieved. A part of the organic light emitting layer 72 located in a region of the second pixel opening K4 covers a side wall of the second pixel opening K4, and the other part covers a part of a bottom surface of the second pixel opening K4 and a slope is formed on the bottom surface of the second pixel opening K4. In an exemplary embodiment, the organic light emitting layer 72 located on the bottom surface of the second pixel opening K4 is separated from the second auxiliary electrode 62 by a distance, and a region between the organic light emitting layer 72 and the second auxiliary electrode 62 exposes the first auxiliary electrode 61.

In an exemplary embodiment, the organic light emitting layer may include an Emitting Layer (EML for short), and any one or more layers of following: a Hole Injection Layer (HIL for short), a Hole Transport Layer (HTL for short), an Electron Block Layer (EBL for short), a Hole Block Layer (HBL for short), an Electron Transport Layer (ETL for short), and an Electron Injection Layer (EIL for short). In an exemplary embodiment, the organic light emitting layer may be formed by evaporating by using a Fine Metal Mask (FMM for short) or an Open Mask, or may be formed by an ink-jet process.

In an exemplary embodiment, the organic light emitting layer may be prepared by using a preparation method as follows. A hole injection layer and a hole transport layer are evaporated in sequence by using an Open Mask, and a common layer of the hole injection layer and the hole transport layer is formed on the display substrate. Then, an electron block layer and a red emitting layer are evaporated on a red sub-pixel, an electron block layer and a green emitting layer are evaporated on a green sub-pixel, and an electron block layer and a blue emitting layer are evaporated on a blue sub-pixel by using a Fine Metal Mask. Electron block layers and emitting layers of adjacent sub-pixels may have a small amount of overlap (for example, an area of an overlapping part accounts for less than 10% of an area of a respective emitting layer pattern), or may be isolated. Then, a hole block layer, an electron transport layer, an electron injection layer are evaporated in sequence by using the Open Mask. A common layer of the hole block layer, the electron transport layer, and the electron injection layer is formed on the display substrate.

In an exemplary embodiment, the electron block layer may serve as a micro-cavity adjustment layer of a light emitting device. By designing a thickness of the electron block layer, a thickness of the organic light emitting layer between a cathode and an anode may meet a design of a length of a micro-cavity. In some exemplary embodiments, the hole transport layer, the hole block layer, or the electron transport layer in the organic light emitting layer may be used as the micro-cavity adjustment layer of the light emitting device, which is not limited in the present disclosure herein.

In an exemplary embodiment, the emitting layer may include a host material and a dopant material doped in the host material. A doping ratio of the dopant material of the emitting layer is 1% to 20%. Within a range of the doping ratio, in one aspect, the host material of the emitting layer may effectively transfer exciton energy to the dopant material of the emitting layer to excite the dopant material of the emitting layer to emit light, in another aspect, the dopant material of the emitting layer is "diluted" by the host material of the emitting layer, which effectively improves collision between molecules of the dopant material of the emitting layer and fluorescence quenching caused by collision between energies, improves a light emitting efficiency and a device lifetime. In an exemplary embodiment, the doping ratio refers to a ratio of mass of the dopant material to mass of the emitting layer, that is, a mass percentage. In an exemplary embodiment, the host material and the dopant material may be co-evaporated through a multi-source evaporation process, so that the host material and the dopant material are uniformly dispersed in the emitting layer, the doping ratio may be regulated and controlled by controlling an evaporation rate of the dopant material, or the doping ratio may be regulated and controlled by controlling an evaporation rate of the host material and the dopant material in an evaporation process. In an exemplary embodiment, a thickness of the emitting layer may be about 10 nm to 50 nm.

In an exemplary embodiment, the hole injection layer may be made of an inorganic oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a p-type dopant of a strong electron absorption system and a dopant of a hole transport material. In an exemplary embodiment, a thickness of the hole injection layer may be about 5 nm to 20 nm.

In an exemplary embodiment, the hole transport layer may be made of a material having a high hole mobility, such as an aromatic amine compound, and a substituent group thereof may be carbazole, methylfluorene, spirofluorene, dibenzothiophene, or furan, etc. In an exemplary embodiment, a thickness of the hole transport layer may be about 40 nm to 150 nm.

In an exemplary embodiment, the hole block layer and the electron transport layer may be made of aromatic heterocyclic compounds, for example, imidazole derivatives such as benzimidazole derivatives, imidazopyridine derivatives, benzimidazole phenanthridine derivatives, etc.; azine derivatives such as pyrimidine derivatives and triazine derivatives; and chemical compounds including nitrogen-containing hexatomic ring structures (also including compounds with phosphine oxide substituents on heterocycles) such as quinoline derivatives, isoquinoline derivatives, and phenanthroline derivatives. In an exemplary embodiment, a thickness of the hole block layer may be about 5 nm to 15 nm, and a thickness of the electron transport layer may be about 20 nm to 50 nm.

In an exemplary embodiment, the electron injection layer may be made of an alkali metal or a metal such as a material of Lithium Fluoride (LiF), Ytterbium (Yb), Magnesium (Mg), or Calcium (Ca), or a compound of these alkali metals or metals. In an exemplary embodiment, a thickness of the electron injection layer may be about 0.5 nm to 2 nm.

(12) A cathode pattern is formed. In an exemplary embodiment, the operation that the cathode pattern is formed may include that: a cathode material is evaporated on the base on which the forgoing patterns are formed, so as to form a pattern of the cathode 80. The cathode 80 is connected to the organic light emitting layer 72, and a large-area contact connection between the cathode 80 and the auxiliary electrode 60 is achieved in a manner of wrapping the organic light emitting block 73 and the auxiliary electrode 60, as shown in FIG. 17.

In an exemplary embodiment, the cathode 80 may be of an integrated structure communicated together. In a region other than the auxiliary electrode 60, the cathode 80 is arranged on the organic light emitting layer 72. In a region where the auxiliary electrode 60 is located, the cathode 80, in one aspect, is arranged on an exposed surface of the organic light emitting block 73, in other aspect, is arranged on an exposed surface of the auxiliary electrode 60, so as to form a structure wrapping the auxiliary electrode 60 and the organic light emitting block 73

Figure 17:
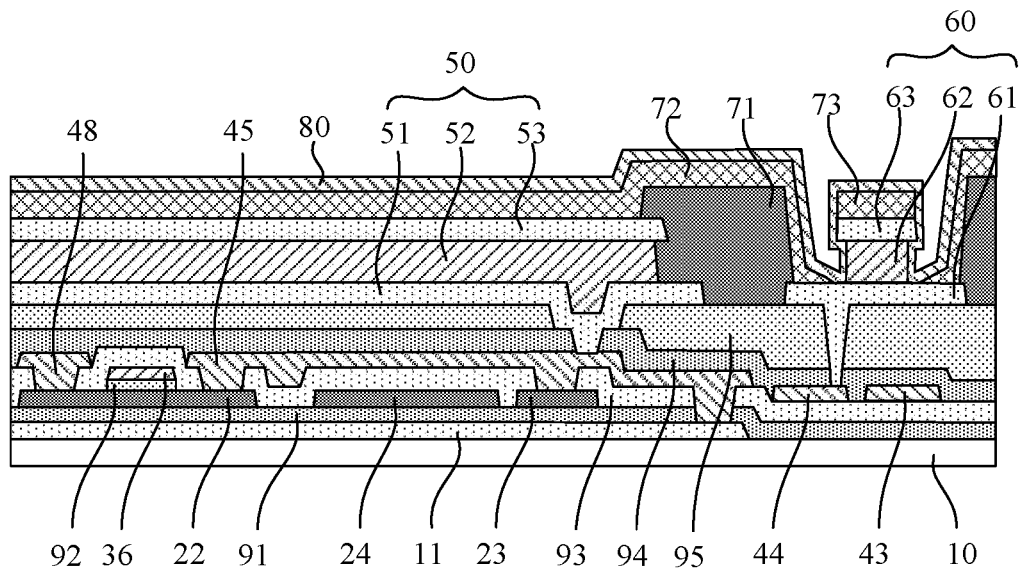
FIG. 17 is a schematic diagram after a cathode pattern is formed according to an embodiment of the present disclosure.

As shown in FIG. 14 and FIG. 17, for the organic light emitting block 73, a part of the cathode 80 covers or partially covers a surface of the organic light emitting block 73 away from the base, and the other part of the cathode 80 covers or partially covers a side surface of the organic light emitting block 73. For the third auxiliary electrode 63, the organic light emitting block 73 covers or partially covers a surface of the third auxiliary electrode 63 away from the base. A part of the cathode 80 covers or partially covers the second side surface 632 of the third auxiliary electrode 63, and the other part of the cathode 80 covers or partially covers the second bottom surface 633 on the lower side of the third auxiliary electrode 63, that is, the cathode 80 covers or partially covers a bottom surface of a part of the third auxiliary electrode 63 protruding from the second auxiliary electrode 62. Thus, not only a connection between the cathode 80 and the third auxiliary electrode 63 is achieved, but also wrapping of the organic light emitting block 73 is achieved. Since the cathode 80 and the third auxiliary electrode 63 are connected through the third side surface 632 and the third bottom surface 633, a potential of the cathode 80 on an upper side of the organic light emitting block 73 is equal to a potential of the third auxiliary electrode 63 on a lower side of the organic light emitting block 73, that is, potentials of the upper side and the lower side of the organic light emitting block 73 are equal, which ensures that the organic light emitting block 73 does not emit light, and avoids a flickering phenomenon caused by emitting light from the organic light emitting block 73. For the second auxiliary electrode 62, the cathode 80 covers or partially covers the second side surface 621 of the side part of the second auxiliary electrode 62. For the first auxiliary electrode 61, the cathode 80 covers or partially covers the first auxiliary electrode 61 exposed between the organic light emitting layer 72 and the second auxiliary electrode 62.

According to an exemplary embodiment of the present disclosure, through a contact connection between a cathode and a side surface of a second auxiliary electrode, a contact area between the cathode and an auxiliary electrode is effectively increased, a resistance at a contact interface is effectively reduced, and a display effect is displayed.

Thus, a pattern of a light emitting structure layer is prepared and completed on a driving circuit layer. The light emitting structure layer includes an anode, an auxiliary electrode, a pixel definition layer, an organic light emitting layer, and a cathode. The organic light emitting layer is connected to the anode and the cathode respectively. The cathode is connected to the auxiliary electrode, and the auxiliary electrode is connected to a second power line.

In an exemplary embodiment of the present disclosure, a preparation process of the display substrate may include that a pattern of an encapsulation layer is formed. An operation that the pattern of the encapsulation layer is formed may include: first, a first inorganic thin film is deposited by using an Open Mask in a manner of Plasma Enhanced Chemical Vapor Deposition (PECVD), so as to form a first encapsulation layer. Then, an organic material is ink-jet printed on the first encapsulation layer by using an ink-jet printing process, and a second encapsulation layer is formed after curing and forming a film. Then, a second inorganic thin film is deposited by using an Open Mask, so as to form a third encapsulation layer. The first encapsulation layer, the second encapsulation layer, and the third encapsulation layer form the encapsulation layer. In an exemplary embodiment, the first encapsulation layer and the third encapsulation layer may be made of any one or more of Silicon Oxide (SiOx), Silicon Nitride (SiNx), and Silicon Oxynitride (SiON), may be a single layer, a plurality of layers, or a composite layer. The second encapsulation layer may be made of a resin material, so as to form a stacking material of an inorganic material/an organic material/an inorganic material. An organic material layer is arranged between two inorganic material layers, which may ensure that external moisture cannot enter the light emitting structure layer.

In an exemplary embodiment, after the encapsulation layer is prepared and completed, a touch structure layer (TSP) may be formed on the encapsulation layer. The touch structure layer may include a touch electrode layer, or include a touch electrode layer and a touch insulation layer.

In an exemplary embodiment, when a Flexible Display substrate is prepared, a preparation process of the display substrate may include processes of peeling a glass carrier plate, attaching a back film, cutting, and the like, which is not limited by the present disclosure herein.

It may be seen from the structure of the display substrate and the preparation process thereof of the exemplary embodiments of the present disclosure, in a plane perpendicular to the display substrate, according to the exemplary embodiment of the present disclosure, the cross-sectional shape of the auxiliary electrode is arranged as a shape like the Chinese character "工", the organic light emitting layer is cut off at the edge of the auxiliary electrode, so as to isolate the organic light emitting block above the auxiliary electrode, which may effectively avoid interference of the organic light emitting block on emergent light, improves quality of the emergent light, and facilitates improvement of display quality. In a plane perpendicular to the display substrate, according to the exemplary embodiment of the present disclosure, the third auxiliary electrode in the auxiliary electrode is arranged to protrude from the second auxiliary electrode, and the cathode is connected to the third auxiliary electrode, which achieves that potentials on both sides of the organic light emitting block are the same, ensures that the organic light emitting block does not emit light, and avoids a flickering phenomenon caused by emitting light from the organic light emitting block. According to the exemplary embodiment of the present disclosure, through a contact connection between the cathode and a side surface of the auxiliary electrode, a contact area between the cathode and the auxiliary electrode is effectively increased, a resistance at a contact interface is effectively reduced, and a display effect is displayed. Since a laser drilling process is not used for the preparation method of the display substrate according to the exemplary embodiments of the present disclosure, which not only shortens the tact time of a single product, but also does not produce particles during a preparation process. Therefore, a production efficiency and a product yield are improved. The preparation method of the display substrate according to the exemplary embodiments of the present disclosure has good process compatibility, simple process realization, easy implementation, a high production efficiency, a low production cost, and a high yield.

In an exemplary embodiment, the display substrate may be prepared by using another preparation method. The another preparation process of the display substrate may include following operations.

(21) Processes of preparing a base and a driving circuit layer are the same as those of preparing the base and the driving circuit layer in the foregoing embodiments, which will not be repeated here.

Figure 18:
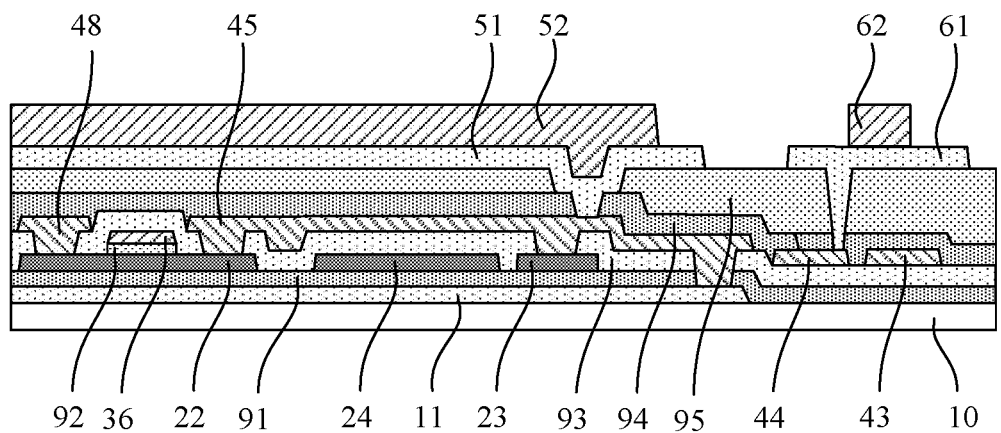
FIG. 18 is another schematic diagram after patterns of an anode and an auxiliary electrode are formed according to an embodiment of the present disclosure.

(22) Patterns of a first transparent conductive layer and a fourth metal layer are formed. In an exemplary embodiment, the operation that patterns of the first transparent conductive layer and the fourth metal layer are formed may include that: a first transparent conductive thin film and a fourth metal thin film are sequentially deposited on the base on which the foregoing patterns are formed; and the first transparent conductive thin film and the fourth metal thin film are patterned through a patterning process, so as to form the patterns of the first transparent conductive layer and the fourth metal layer. In an exemplary embodiment, the pattern of the first conductive layer at least includes a first anode 51 and a first auxiliary electrode 61. The anode 51 is connected to a second capacitor polar plate 45 through an anode via. The first auxiliary electrode 61 is connected to a second power line 44 through an electrode via. The fourth metal layer at least includes a second anode 52 and a second auxiliary electrode 62. The second anode 52 is arranged on one side, away from the base, of the first anode 51 and is connected to the first anode 51. The second auxiliary electrode 62 is arranged on one side, away from the base, of the first auxiliary electrode 61, and is connected to the first auxiliary electrode 61, as shown in FIG. 18.

In an exemplary embodiment, the first transparent conductive thin film and the fourth metal thin film may be patterned through a patterning process using a halftone or gray tone mask. For example, the patterning may include that: the fourth metal thin film is coated with a layer of positive photoresist; the photoresist is exposed by using the halftone or gray tone mask, so that the photoresist forms a fully exposed region, a partially exposed region, and an unexposed region. Then, a developing treatment is performed. The photoresist in the unexposed region is retained, and the photoresist has a first thickness. The photoresist with a partial thickness in the partially exposed region is removed, and the photoresist has a second thickness. The second thickness is less than the first thickness. All photoresist in the fully exposed region is removed to expose a surface of the fourth metal thin film. Then, a first etching treatment is performed to etch away the first transparent conductive thin film and the fourth metal thin film in the fully exposed region, so as to form the patterns of the first anode 51 and the first auxiliary electrode 61. Then, a graying treatment is performed to remove the photoresist with the second thickness in the partially exposed region, so as to expose the surface of the fourth metal thin film. Then, a second etching treatment is performed to etch away the fourth metal thin film in the partially exposed region, so as to form the patterns of the second anode 52 and the second auxiliary electrode 62.

(23) Patterns of a third anode and a third auxiliary electrode are formed. In an exemplary embodiment, the operation that the patterns of the third anode and the third auxiliary electrode are formed may include that: a second transparent conductive thin film is deposited on the base on which the foregoing patterns are formed. The second transparent conductive thin film is patterned through a patterning process, so as to form patterns of a third anode 53 and a third auxiliary electrode 63. The third anode 53 is arranged on one side, away from the base, of the second anode 52, and is connected to the second anode 52. The third auxiliary electrode 63 is arranged on one side, away from the base, of the second auxiliary electrode 62, and is connected to the second auxiliary electrode 62. The first anode 51, the second anode 52, and the third anode 53 that are stacked form an anode 50, and the first auxiliary electrode 61, the second auxiliary electrode 62, and the third auxiliary electrode 63 that are stacked form an auxiliary electrode 60, as shown in FIG. 13.

In an exemplary embodiment, during the patterning of the second transparent conductive thin film, a first etching liquid and a second etching liquid may be used for performing etching respectively, and a structure like the Chinese character " 工 " of the auxiliary electrode and a structure like the Chinese character " 工 " of the anode are formed by drilling. In an exemplary embodiment, the first etching liquid may be an etching liquid (ITO etching liquid) for etching a transparent conductive material, and the second etching liquid may be an etching liquid (Metal etching liquid) for etching a metal material. In an exemplary embodiment, an etching process may include that: the second transparent conductive thin film is etched by using the ITO etching liquid first, so as to form patterns of the third anode 53 and the third auxiliary electrode 63. Then, the Metal etching liquid is used for continuing etching. Since a rate at which the Metal etching liquid is used for etching the second anode 52 and the second auxiliary electrode 62 is greater than a rate at which the Metal etching liquid is used for etching the third anode 53 and the third auxiliary electrode 63, side surfaces of the second anode 52 and the second auxiliary electrode 62 are etched into pits. The first anode 51 below the second anode 52 and the third anode 53 above the second anode 52 both protrude from the second anode 52 by a distance, so as to form a structure like the Chinese character " 工 ." The first auxiliary electrode 61 below the second auxiliary electrode 62 and the third auxiliary electrode 63 above the second auxiliary electrode 62 protrude from the second auxiliary electrode 62 by a distance, so as to form a structure like the Chinese character " 工 ".

(24) Processes of forming a pixel definition layer, an organic light emitting layer, a cathode, and the like are the same as that in the foregoing embodiments, which will not be repeated here.

As shown in FIG. 5 to FIG. 18, the display substrate prepared through the foregoing preparation process may include: a base 10; a first conductive layer arranged on the base 10, the first conductive layer at least including a shielding layer 11; a first insulation layer 91 covering the first conductive layer; a semiconductor layer arranged on the first insulation layer 91, the semiconductor layer at least including a first capacitor polar plate 24 and active layers of a plurality of transistors; a second insulation layer 92 arranged on the semiconductor layer; a second conductive layer arranged on the second insulation layer 92, the second conductive layer at least including gate electrodes of the plurality of transistors; a third insulation layer 93 covering the second conductive layer; a third conductive layer arranged on the third insulation layer 93, the third conductive layer at least including a second power line 44, a second capacitor polar plate 45, and first electrodes and second electrodes of the plurality of transistors, the second capacitor polar plate 45 being connected to the shielding layer 11 through a via, the second capacitor polar plate 45 and the first capacitor polar plate 24 forming a first storage capacitor, and the shielding layer 11 and the first capacitor polar plate 24 forming a second storage capacitor; a fourth insulation layer 94 covering the third conductive layer; a planarization layer 95 arranged on the fourth insulation layer 94; an anode 50 and an auxiliary electrode 60 arranged on the planarization layer 95, the anode 50 including a first anode 51, a second anode 52, and a third anode 53 that are stacked and form a structure like the Chinese character " 工 ", and the auxiliary electrode 60 including a first auxiliary electrode 61, a second auxiliary electrode 62, and a third auxiliary electrode 63 that are stacked and form a structure like the Chinese character " 工 "; a pixel definition layer 71 arranged on the planarization layer 95, a first pixel opening and a second pixel opening being formed on the pixel definition layer 71, the first pixel opening exposing the third anode 53, and the second pixel opening exposing the second auxiliary electrode 62 and the third auxiliary electrode 63; an organic light emitting layer 72 arranged on the pixel definition layer 71 and an organic light emitting block 73 arranged on the third auxiliary electrode 63, the organic light emitting layer 72 being connected to the third anode 53 through the first pixel opening, and the organic light emitting block 73 being isolated from the organic light emitting layer 72; a cathode 80 arranged on the organic light emitting layer 72, the cathode 80 being connected to the organic light emitting layer 72, and a large-area contact connection between the cathode 80 and the auxiliary electrode 40 being achieved in a manner of wrapping the organic light emitting block 73 and the auxiliary electrode 40; and an encapsulation layer arranged on the cathode 80, the encapsulation layer including a first encapsulation layer, a second encapsulation layer, and a third encapsulation layer that are stacked.

The structures and preparation processes thereof shown in the exemplary embodiments of the present disclosure are merely an illustrative description. In an exemplary embodiment, a corresponding structure may be modified and patterning processes may be increased or decreased according to actual needs. For example, a transistor in a driving circuit layer may be of a top-gate structure. For another example, another film layer structure, electrode structure, or lead structure may further be arranged in a driving circuit layer and a light emitting structure layer. For another example, a base may be a glass base, which is not specifically limited in the present disclosure herein.

The present disclosure further provides a preparation method of a display substrate. In an exemplary embodiment, the preparation method may include: forming a driving circuit layer on a base; and forming a light emitting structure layer on the driving circuit layer. The light emitting structure layer includes an anode, an organic light emitting layer, an organic light emitting block, a cathode, and an auxiliary electrode. The organic light emitting layer is connected to the anode and the cathode respectively. The auxiliary electrode includes a bottom surface close to the base, a top surface away from the base, and a side surface arranged between the bottom surface and the top surface. The cathode is in contact with the side surface of the auxiliary electrode. The organic light emitting block is arranged on the top surface, away from the base, of the auxiliary electrode. The organic light emitting block is isolated from the organic light emitting layer.

The present disclosure provides the preparation method of the display substrate. The cross-sectional shape of the auxiliary electrode is arranged as a shape like the Chinese character " 工 ", so that the organic light emitting layer is cut off at the edge of the auxiliary electrode and is isolated from the organic light emitting block located above the auxiliary electrode, which may effectively avoid interference of the organic light emitting block on emergent light, improves quality of the emergent light, and facilitates improvement of display quality. The third auxiliary electrode in the auxiliary electrode is arranged to protrude from the second auxiliary electrode, and the cathode is connected to the third auxiliary electrode, thereby achieving that potentials on both sides of the organic light emitting block are the same, ensuring that the organic light emitting block does not emit light, and avoiding a flickering phenomenon caused by emitting light from the organic light emitting block. According to an exemplary embodiment of the present disclosure, through a contact connection between the cathode and the side surface of the auxiliary electrode, a contact area between the cathode and the auxiliary electrode is effectively increased, a resistance at a contact interface is effectively reduced, and a display effect is improved. Since a laser drilling process does not used in the preparation method of the present disclosure, which not only shortens tact time of a single product, but also does not produce particles in a preparation process. Therefore, a production efficiency and a product yield are improved. The preparation method of the display substrate according to the exemplary embodiments of the present disclosure has good process compatibility, simple process realization, easy implementation, a high production efficiency, a low production cost, and a high yield.

The present disclosure further provides a display apparatus, including the display substrate of the abovementioned embodiments. The display apparatus may be: any product or component with a display function, such as a mobile phone, a tablet computer, a television, a display, a notebook computer, a digital photo frame, or a navigator.

Although the embodiments disclosed in the present disclosure are as above, the described contents are only embodiments adopted for convenience of understanding the present disclosure and are not intended to limit the present disclosure. Any person skilled in the art to which the present disclosure pertains may make any modification and change in forms and details of implementation without departing from the spirit and scope disclosed in the present disclosure. However, the scope of patent protection of the present disclosure is still subject to the scope defined in the appended claims.

The invention claimed is:

1. A display substrate, comprising a driving circuit layer arranged on a base and a light emitting structure layer arranged on one side, away from the base, of the driving circuit layer, wherein the light emitting structure layer comprises an anode, a pixel definition layer, an organic light emitting layer, a cathode, and an auxiliary electrode;

the pixel definition layer has a first pixel opening exposing the anode and a second pixel opening exposing the auxiliary electrode; the organic light emitting layer connected to the anode and the cathode connected to the organic light emitting layer are arranged in the first pixel opening; the organic light emitting layer separated from the auxiliary electrode and the cathode located on one side, away from the base, of the organic light emitting layer are arranged in the second pixel opening; and the cathode is connected to the auxiliary electrode in the second pixel opening, wherein the auxiliary electrode comprises a first auxiliary electrode, a second auxiliary electrode arranged on one side, away from the base, of the first auxiliary electrode, and a third auxiliary electrode arranged on one side, away from the base, of the second auxiliary electrode; an orthographic projection of the second auxiliary electrode on the base is located within a range of an orthographic projection of the third auxiliary electrode on the base; and the orthographic projection of the second auxiliary electrode on the base is located within a range of an orthographic projection of the first auxiliary electrode on the base.

2. The display substrate according to claim 1, wherein, in a plane perpendicular to the base, a distance between an edge of the auxiliary electrode close to an edge of a top surface of the organic light emitting layer, and the edge of the top surface of the organic light emitting layer located in the second pixel opening is greater than 1 μm.

3. The display substrate according to claim 1, wherein, in a plane perpendicular to the base, a ratio of a thickness of an edge part, close to the auxiliary electrode, of the cathode located on a surface of the organic light emitting layer away from the base, to a thickness of an edge part, close to the pixel definition layer, of the cathode is 0.8 to 1.2.

4. The display substrate according to claim 1, wherein a distance between an edge, close to the organic light emitting layer, of a surface, close to the base, of the third auxiliary electrode, and an edge, close to the organic light emitting layer, of a surface, away from the base, of the second auxiliary electrode is less than 1.25 μm.

5. The display substrate according to claim 1, wherein the cathode is in contact with each of: one side of an organic light emitting block away from the base, the first auxiliary electrode, the second auxiliary electrode, and the third auxiliary electrode.

6. The display substrate according to claim 5, wherein for the auxiliary electrode and the organic light emitting block that are stacked, the cathode is in contact with each of: a surface of the organic light emitting block away from the base, a side surface of the organic light emitting block, a side surface of the third auxiliary electrode, a surface, close to the base, of a part of the third auxiliary electrode protruding from the second auxiliary electrode, and a side surface of the second auxiliary electrode.

7. The display substrate according to claim 1, wherein the anode comprises a first anode layer, a second anode layer arranged on one side, away from the base, of the first anode layer, and a third anode layer arranged on one side, away from the base, of the second anode; an orthographic projection of the second anode layer on the base is located within a range of an orthographic projection of the first anode layer on the base; and the orthographic projection of the second anode layer on the base is located within a range of an orthographic projection of the third anode layer on the base.

8. The display substrate according to claim 7, wherein the first anode layer and the first auxiliary electrode are arranged in a same layer and are made of a same material; the second anode layer and the second auxiliary electrode are arranged in a same layer and are made of a same material; and the third anode layer and the third auxiliary electrode are arranged in a same layer and are made of a same material.

9. The display substrate according to claim 1, wherein the organic light emitting layer is arranged on the first auxiliary electrode; a slope is formed on one side, close to the auxiliary electrode, of the organic light emitting layer; the cathode is arranged on the slope; a thickness, in a direction perpendicular to the slope, of the cathode located on the slope is less than a thickness, in a direction perpendicular to the base, of the cathode located on one side, away from the base, of the organic light emitting layer.

10. The display substrate according to claim 1, wherein an orthographic projection of the second pixel opening on the base is located within a range of an orthographic projection of the first auxiliary electrode on the base.

11. The display substrate according to claim 1, wherein the cathode comprises a first horizontal overlapping part and a second side wall overlapping part; the first horizontal overlapping part is overlapped with the first auxiliary electrode; the second side wall overlapping part is overlapped with the second auxiliary electrode; and a thickness of the second side wall overlapping part in a direction parallel to the base is greater than a thickness of the first horizontal overlapping part in a direction perpendicular to the base.

12. The display substrate according to claim 11, wherein the second side wall overlapping part is connected to the first auxiliary electrode; the second side wall overlapping part is in contact with a surface, close to the base, of the third auxiliary electrode; and the second side wall overlapping part is connected to the first horizontal overlapping part.

13. The display substrate according to claim 1, wherein the driving circuit layer comprises: a transistor and a power electrode located on the base, a passivation layer located on one side, away from the base, of the transistor and the power electrode, and a planarization layer located on one side, away from the base, of the passivation layer; the passivation layer and the planarization layer have anode vias and electrode vias; the anode vias expose a drain electrode of the transistor; and the electrode vias expose the power electrode.

14. The display substrate according to claim 13, wherein the anode is connected to the drain electrode of the transistor through the anode vias; and the auxiliary electrode is connected to the power electrode through the electrode vias.

15. The display substrate according to claim 13, wherein the light emitting structure layer further comprises an organic light emitting block; the organic light emitting block is arranged on one side, away from the base, of the auxiliary electrode; an orthographic projection of the organic light emitting block on the base is overlapped with an orthographic projection of the auxiliary electrode on the base; the organic light emitting block and the organic light emitting layer are arranged in a same layer and are made of a same material, and the organic light emitting block is isolated from the organic light emitting layer.

16. The display substrate according to claim 15, wherein a thickness, in a direction parallel to the base, of the cathode located on a side wall of the organic light emitting block is less than a thickness, in a direction perpendicular to the base, of the cathode located on one side, away from the base, of the organic light emitting block.

17. The display substrate according to claim 13, wherein orthographic projections of the electrode vias on the base are located within a range of an orthographic projection of the auxiliary electrode on the base.

18. A display apparatus, comprising the display substrate according to claim 1.

19. A preparation method of a display substrate, comprising:
    forming a driving circuit layer on a base; and
    forming a light emitting structure layer on the driving circuit layer, wherein the light emitting structure layer comprises an anode, a pixel definition layer, an organic light emitting layer, a cathode, and an auxiliary electrode; the pixel definition layer has a first pixel opening exposing the anode and a second pixel opening exposing the auxiliary electrode; the organic light emitting layer connected to the anode and the cathode connected to the organic light emitting layer are arranged in the first pixel opening; the organic light emitting layer separated from the auxiliary electrode and the cathode located on one side, away from the base, of the organic light emitting layer are arranged in the second pixel opening; and the cathode is connected to the auxiliary electrode in the second pixel opening, wherein the auxiliary electrode comprises a first auxiliary electrode, a second auxiliary electrode arranged on one side, away from the base, of the first auxiliary electrode, and a third auxiliary electrode arranged on one side, away from the base, of the second auxiliary electrode; an orthographic projection of the second auxiliary electrode on the base is located within a range of an orthographic projection of the third auxiliary electrode on the base; and the orthographic projection of the second auxiliary electrode on the base is located within a range of an orthographic projection of the first auxiliary electrode on the base.

\* \* \* \* \*